(12) United States Patent
Capodieci et al.

(10) Patent No.: US 6,553,562 B2
(45) Date of Patent: Apr. 22, 2003

(54) METHOD AND APPARATUS FOR GENERATING MASKS UTILIZED IN CONJUNCTION WITH DIPOLE ILLUMINATION TECHNIQUES

(75) Inventors: Luigi Capodieci, Santa Cruz, CA (US); Juan Andres Torres Robles, Milpitas, CA (US); Lodewijk Hubertus Van Os, Eindhoven (NL)

(73) Assignees: ASML Masktools B.V., Veldhoven (NL); ASM Lithography B.V., Veldhoven (NL)

( * ) Notice: Subject to any disclaimer, the term of this patent is extended or adjusted under 35 U.S.C. 154(b) by 22 days.

(21) Appl. No.: 09/985,621

(22) Filed: Nov. 5, 2001

(65) Prior Publication Data

US 2002/0166107 A1 Nov. 7, 2002

Related U.S. Application Data

(60) Provisional application No. 60/288,461, filed on May 4, 2001.

(51) Int. Cl.⁷ ............................. G06F 17/50; G03F 9/00
(52) U.S. Cl. ................... 716/19; 716/21; 430/5
(58) Field of Search ....................... 716/19, 20, 21; 430/5, 311

(56) References Cited

U.S. PATENT DOCUMENTS

| | | | | |
|---|---|---|---|---|
| 5,378,917 A | * | 1/1995 | Chalupka et al. ...... 250/492.21 |
| 5,807,649 A | * | 9/1998 | Liebmann et al. .............. 430/5 |
| 5,821,034 A | * | 10/1998 | Kim et al. .................... 430/311 |
| 5,858,580 A | * | 1/1999 | Wang et al. ..................... 430/5 |
| 5,973,771 A | * | 10/1999 | Hibbs et al. ................. 356/121 |
| 6,338,922 B1 | * | 1/2002 | Liebmann et al. .............. 430/5 |
| 6,503,666 B1 | * | 1/2003 | Pierrat ........................... 430/5 |
| 2002/0033457 A1 | * | 3/2002 | Chalupka et al. ......... 250/491.1 |
| 2002/0110753 A1 | * | 8/2002 | Pforr et al. .................. 430/311 |
| 2002/0180943 A1 | * | 12/2002 | Mulkens et al. ............... 355/68 |

* cited by examiner

*Primary Examiner*—Matthew Smith
*Assistant Examiner*—Magid Y Dimyan
(74) *Attorney, Agent, or Firm*—McDermott, Will & Emery

(57) ABSTRACT

A method of generating complementary masks for use in a multiple-exposure lithographic imaging process. The method includes the steps of identifying "horizontal" critical features and "vertical" critical features from a plurality of features forming a layout; identifying interconnection areas which are areas in which one of the horizontal critical features or the vertical critical features contacts another feature of the layout; defining a set of primary parameters on the basis of the proximity of the plurality of features relative to one another; and generating an edge modification plan for each interconnection area based on the primary parameters. A horizontal mask pattern is then generated by compiling the horizontal critical features, a first shield plan for the vertical critical features and the interconnection areas containing a horizontal critical feature modified by the edge modification plan. A vertical mask pattern is then generated by compiling the vertical critical features, a second shield plan for the horizontal critical features and the interconnection areas containing a vertical critical feature modified by the edge modification plan.

28 Claims, 23 Drawing Sheets

Condenser lens

Reticle

Projection lens

Wafer $$NAE = \frac{\text{Area out-of-spec}}{\text{Design Area}}$$

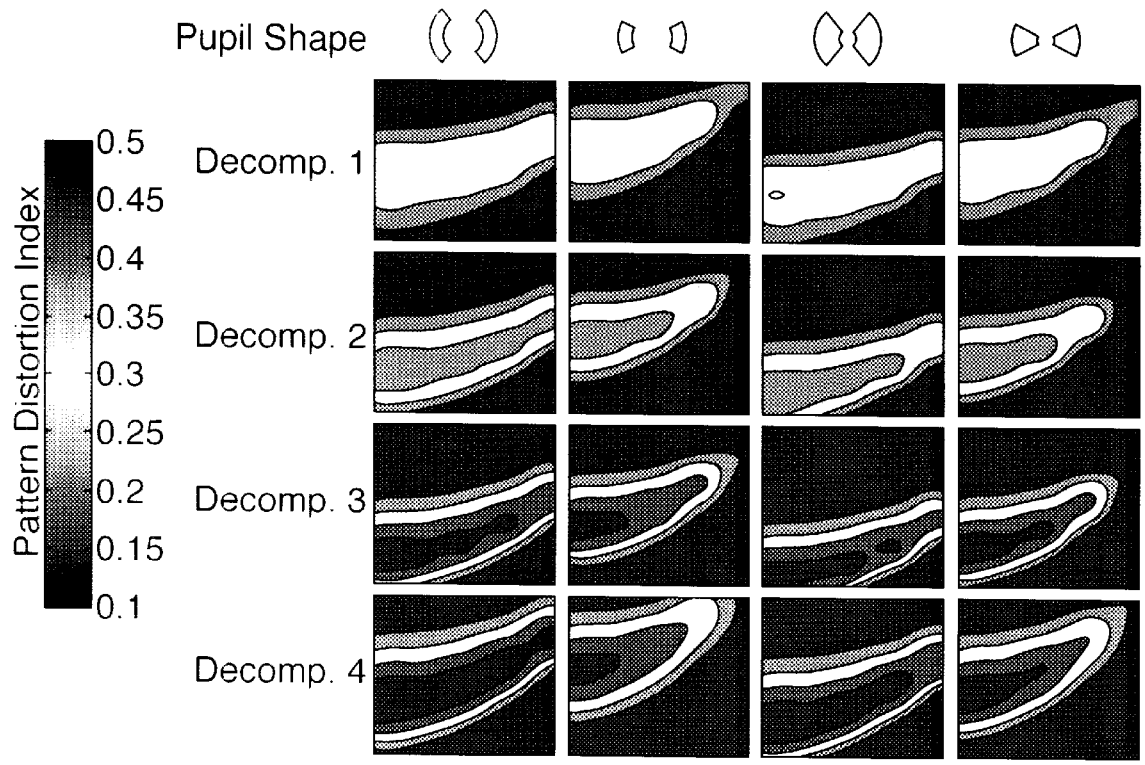

Fig.20(a).
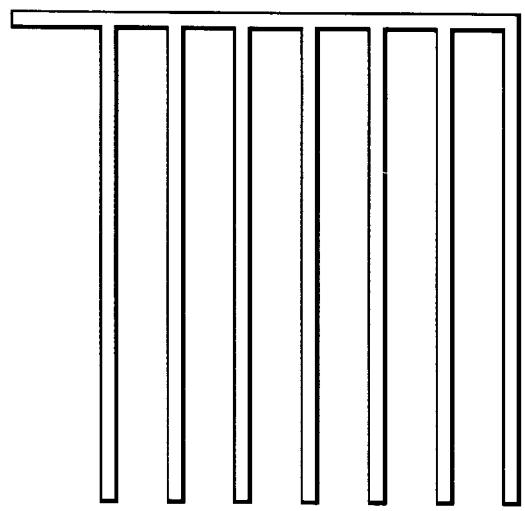
Fig.20(b).
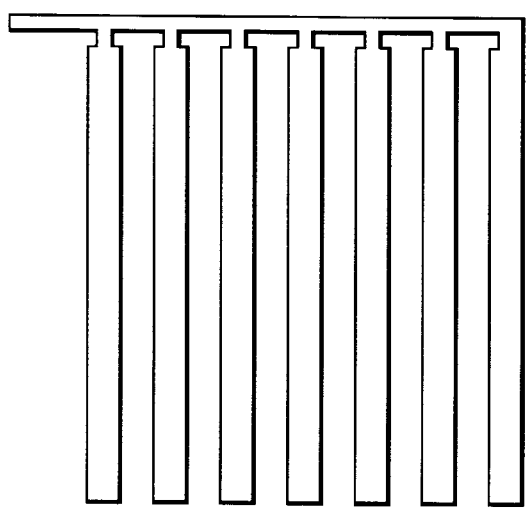
Fig.20(c).
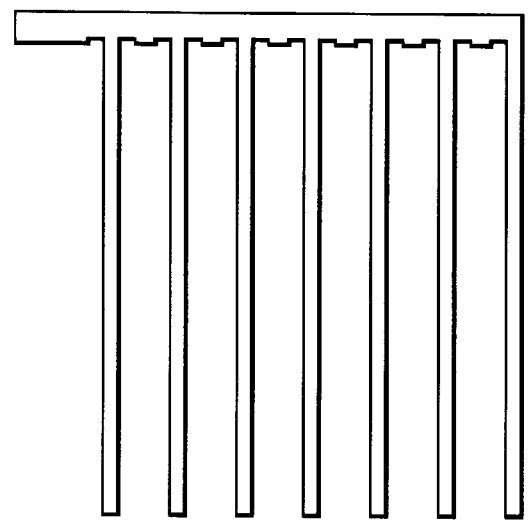

Fig.21(a).
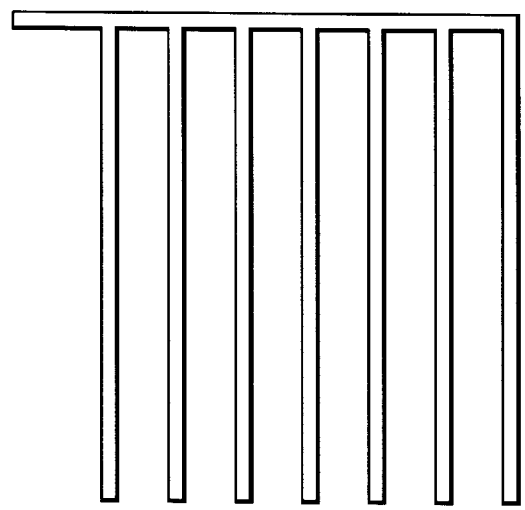
Fig.21(b).
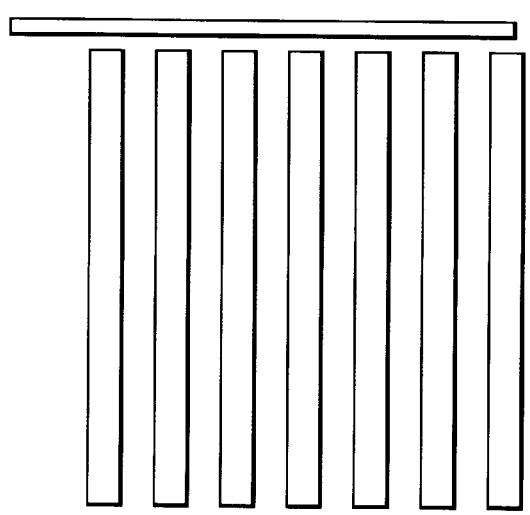
Fig.21(c).
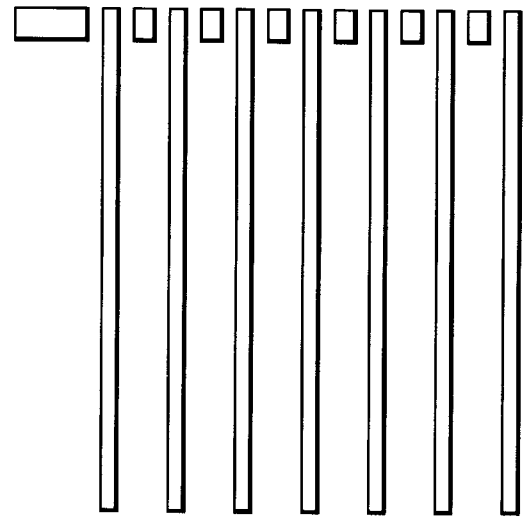

METHOD AND APPARATUS FOR GENERATING MASKS UTILIZED IN CONJUNCTION WITH DIPOLE ILLUMINATION TECHNIQUES

RELATED APPLICATIONS

This application claims priority from U.S. Provisional Application Serial No. 60/288,641, filed May 4, 2001 entitled "Rule-Based Dipole Partitioning for Electronic Design Layouts."

FIELD OF THE INVENTION

The present invention relates to photolithography, and in particular relates to the generation of mask layouts for use with dipole illumination techniques. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5–10 years, as described in the International Technology Roadmap for Semiconductors (ITRS 2000).

Lithographic methods aimed at improving resolution, while retaining acceptable process latitude and robustness are classified as Resolution Enhancement Techniques (RET's) and comprise a very wide range of applications. Examples include: light source modifications (e.g. Off-Axis Illumination), use of special masks, which exploit light interference phenomena (e.g. Attenuated Phase Shift Masks, Alternating Phase Shift Masks, Chromeless Masks, etc.), and mask layout modifications (e.g. Optical Proximity Corrections).

In an off-axis illumination regimen, as illustrated in FIG. 1, increased focus latitude and image contrast are achieved by capturing at least one of the first orders of the pattern spatial frequencies. As shown in FIG. 1, a typical off-axis illumination system includes in-part a light source 11, a mask 12, a lens 13 and the wafer 14 covered with photoresist. With dipole illumination, the light source is confined to two poles, in order to create the conditions for two-beam imaging with theoretical infinite contrast. FIG. 2 illustrates the basic principles of dipole imaging. As shown, a dipole illumination system includes in-part a dipole aperture 16 (or other dipole generating means, such as a suitable diffractive optical element), a condenser lens 17, a mask 18, a projection lens 19 and the wafer 20. The dipole apertures 16 can be of various shapes and orientations, e.g. horizontal, vertical or at any given angle. Exemplary dipole apertures 16 of various sizes and shapes are shown in FIGS. 3(a)–3(h). A detailed description of the concepts of dipole illumination is set forth in U.S. patent application Ser. No. 09/671,802, filed Sep. 28, 2000, which is hereby incorporated by reference.

When dipole illumination is used, resolution is enhanced only for geometrical patterns with orientations perpendicular to the pole orientation axis. For example, a "horizontal" dipole allows the patterning of sub-resolution "vertical" lines or spaces; the terms "vertical" and "horizontal" refer to a set of orthogonal directions in the plane of the geometrical pattern. In a typical dipole application for a layout comprising both horizontal and vertical critical patterns, two exposures are needed with two orthogonal dipole sources, one for each exposure. Therefore, the adoption of dipole illumination for patterning critical layers of generalized electronic design layouts, requires the generation of two mask layouts, where orthogonal features are properly partitioned. However, such partitioning can lead to various problems.

More specifically, in order to accurately reproduce the desired pattern on the wafer, it is necessary to identify and compensate for the "intersection" or "interconnection" areas (e.g., any area/location where a feature positioned in the vertical direction intersects with a feature positioned in the horizontal direction). For example, if all vertical features of a given layout to be printed are included in a "vertical mask" and all horizontal features of the layout to be printed are included in a "horizontal mask", any intersection area between a vertical feature and a horizontal feature is essentially printed twice, which likely results in an undesired deviation from the original design layout.

Accordingly, there exists a need for a method of generating mask layouts for use with dipole illumination techniques that compensates for "intersection" areas between orthogonal features so as to allow accurate reproduction of the desired pattern on the wafer.

SUMMARY OF THE INVENTION

In an effort to solve the foregoing needs, it is one object of the present invention to provide a method for generating mask layouts for use with dipole illumination techniques that account for and compensate for "intersection" areas created by features which contact one another.

More specifically, in one exemplary embodiment, the present invention relates to a method of generating complementary mask patterns for use in a multiple-exposure lithographic imaging process comprising the steps of:

(a) identifying horizontal critical features and vertical critical features from a plurality of features forming a layout, (b) identifying interconnection areas, said interconnection areas comprising areas in which one of said horizontal critical features contacts another feature of said layout, and/or areas in which one of said vertical critical features contacts another feature of said layout, (c) defining a set of primary parameters on the basis of the proximity of said plurality of features relative to one another, (d) generating an edge modification plan for each interconnection area based on said primary parameters, (e) generating a horizontal mask pattern by compiling said horizontal critical features, a first shield plan for said vertical critical features and said interconnection areas containing a horizontal critical feature modified by said edge modification plan, said first shield plan being defined by said primary parameters, and (f) generating a vertical mask pattern by compiling said vertical critical features, a second shield plan for said horizontal critical features and said interconnection areas containing a vertical critical feature modified by said edge modification plan, said second shield plan being defined by said primary parameters.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. For example, the present innovation provides a simple method of generating complementary mask layouts for use with dipole illumination techniques that automatically compensate for "intersection" areas between features so as to allow accurate reproduction of the desired pattern on the wafer. Furthermore, the present invention provides the mask designer an additional means of effecting OPC.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIG. 13 illustrates how variations in pupil shapes and decomposition values affect the pattern distortion map of FIG. 12.

FIG. 14 illustrates an exemplary set of initial conditions utilized for determining the primary parameters in accordance with the present invention.

FIGS. 20(a)–20(c) illustrate "notch" style partitioning for a 7-line comb pattern with a 1:2 line-to-space ratio.

FIGS. 21(a)–21(c) illustrate "trench" style partitioning for a 7-line comb pattern with a 1:2 line-to-space ratio.

DETAILED DESCRIPTION OF THE INVENTION

As is known, state-of-the-art electronic design layouts are made of several hundred million to a few billion polygonal features arranged in various relative orientations (e.g. horizontal, vertical, 45 deg., 30 deg., etc.). Practical dipole implementations use only two sets of orthogonal dipole sources, thus limiting the patterning of critical features to the corresponding complementary orientations. For example, if two sets of horizontal-vertical dipoles are used, then only vertical-horizontal (respectively) critical patterns can be effectively imaged and printed. As stated above, typical dipole sources are illustrated in FIGS. 3(a)–3(h).

A dipole illumination source can be fully characterized utilizing the following four parameters:

1) poles orientation: horizontal/vertical
2) inner radius: $\sigma_{in}$
3) outer radius: $\sigma_{out}$
4) pole angle: $\theta$ (or pole extension for a general shape)

In accordance with the present invention, a first step in the process of generating the mask layouts is classifying the polygonal patterns of the desired design layout into one of the following three groups:

(a) horizontal critical (HC)
(b) vertical critical (VC)
(c) neither horizontal nor vertical critical (NC)

A horizontal critical feature is a substantially rectangular portion of any polygon whose "height" is approximately 2 or more times greater than the minimum critical dimension. Similarly, a vertical critical feature is a substantially rectangular portion of any polygon whose "width" is approximately 2 or mores times greater than the minimum CD. The terms "height" and "width" as used in this context refer to the geometrical extent of the feature in the aforementioned "vertical" and "horizontal" directions. It is noted that the amount that the aforementioned dimensions must exceed the minimum CD is variable and is a function of the lithographic process being utilized and the specific application. The stated rule of approximately 2 or more times greater than the CD is a general rule. However, situations exist where the application of the present invention to vertical and horizontal features having width and height dimensions, respectively, which are less than 2 times the minimum CD, results in improved printing performance. Another method of defining critical features is by means of aspect ratios. For example, by defining critical features as those corresponding an aspect ratio of 2 or more, corresponds to stating that the critical features have a length of at least two times the CD.

Figure 1:
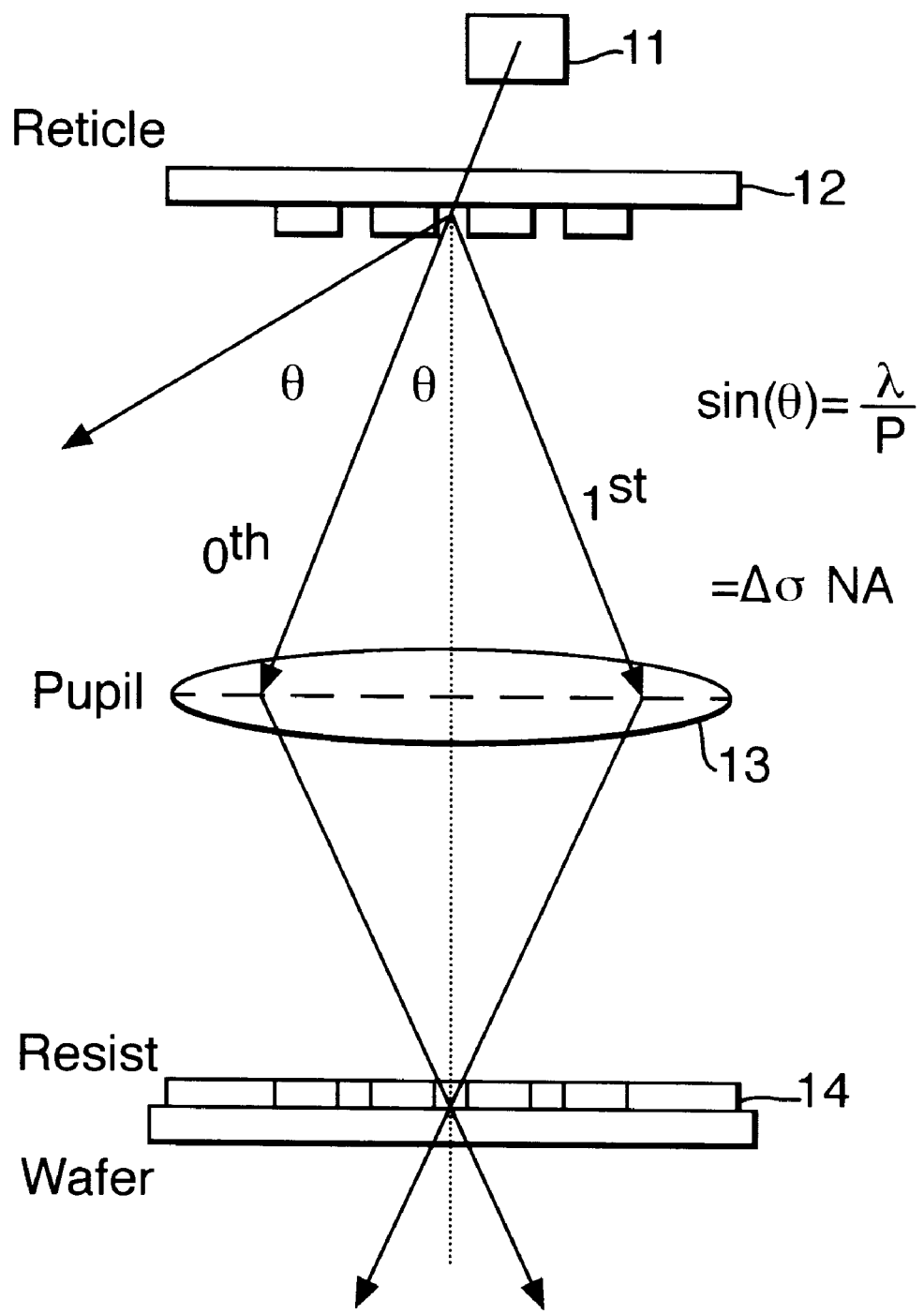
FIG. 1 illustrates the principles of off-axis illumination.
Figure 2:
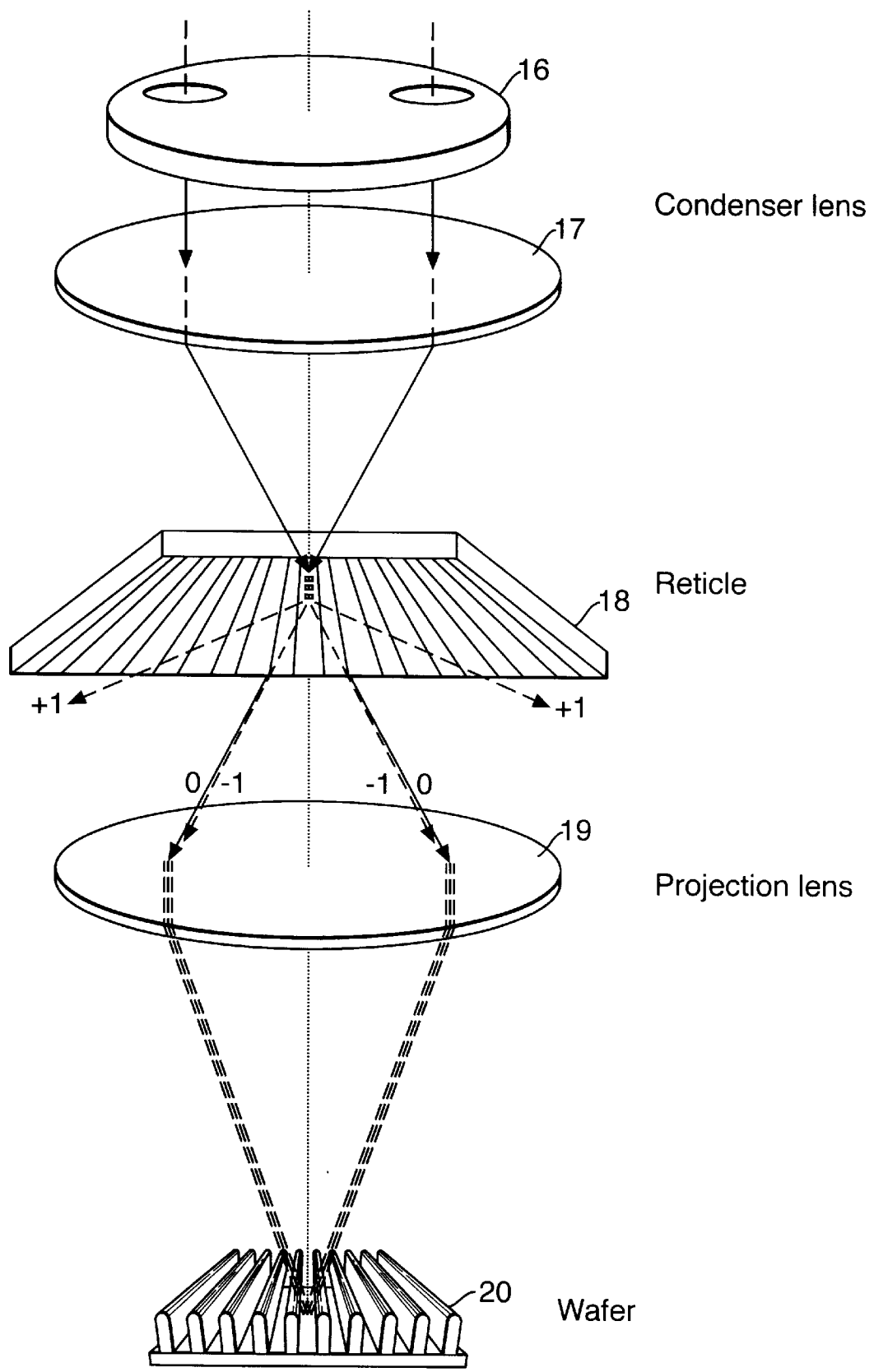
FIG. 2 illustrates the principles of dipole illumination.
Figure 3A:
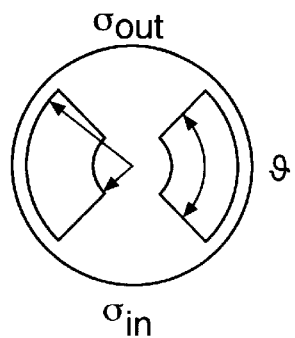
FIGS. 3(a)–3(h) illustrate exemplary shapes of dipole sources.
Figure 3E:
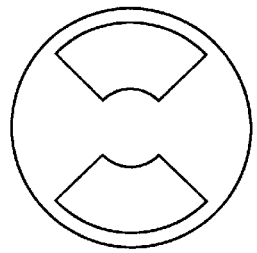
Figure 3B:
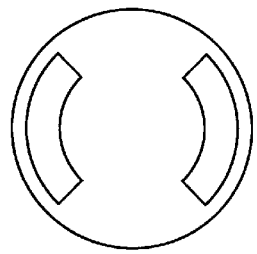
Figure 3F:
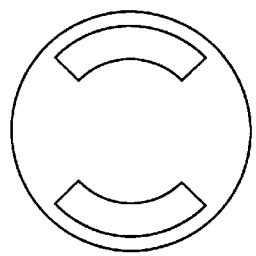
Figure 3C:
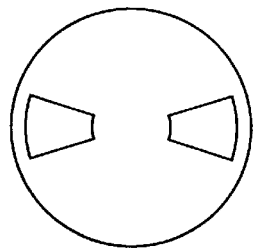
Figure 3G:
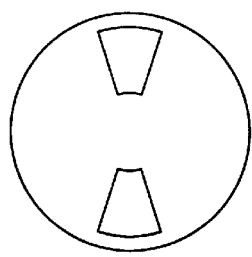
Figure 3D:
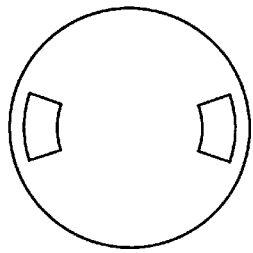
Figure 3H:
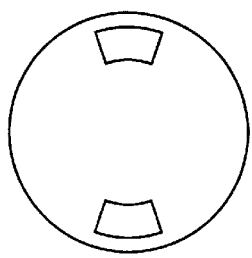
Figure 4:
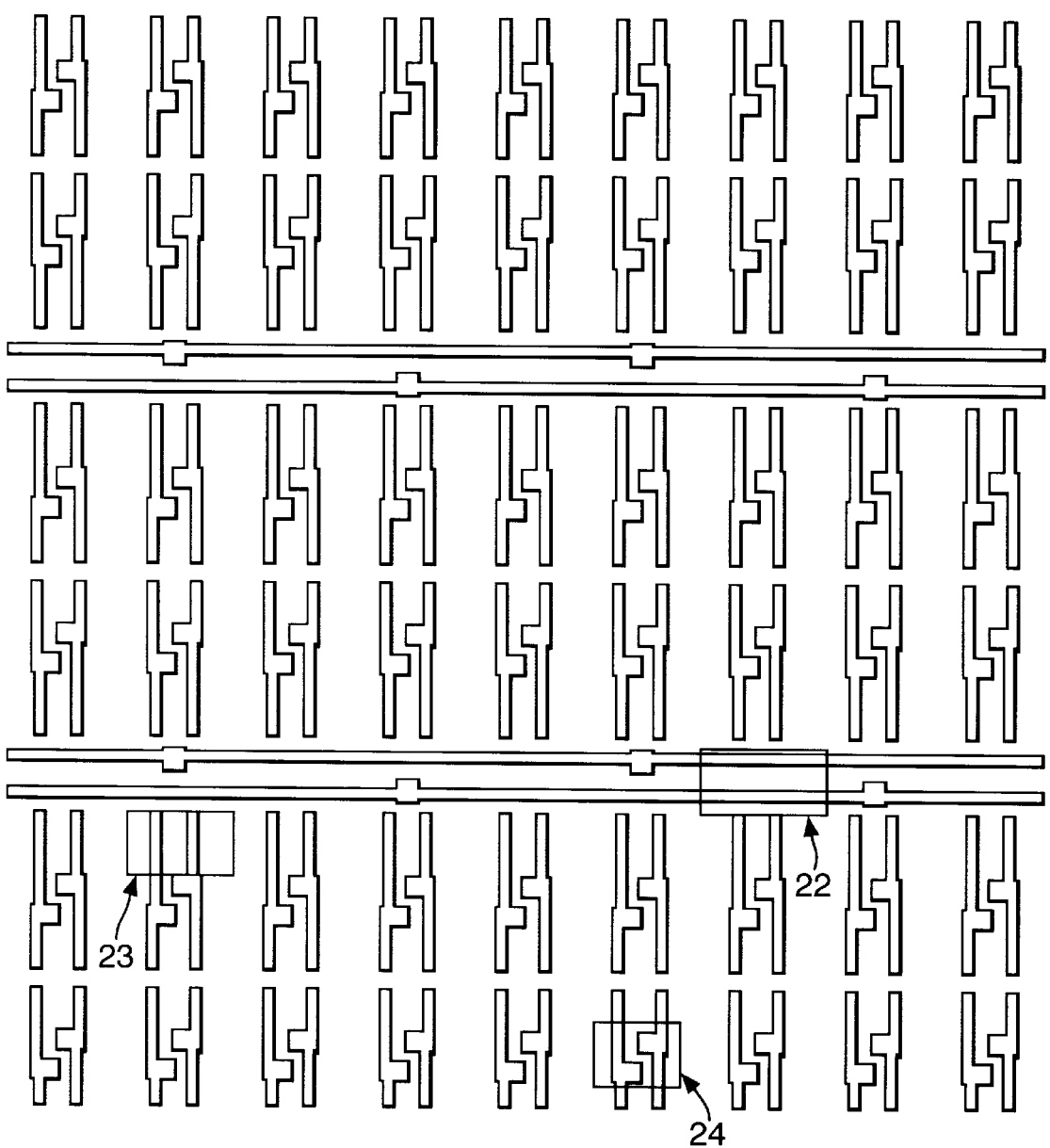
FIG. 4 illustrates an exemplary portion of a design layout comprising HC features and VC features.

After identification of all HC features and VC features, all remaining features are defined as NC features. An example of an NC feature is a large square feature. FIG. 4 illustrates a portion of a (memory-like) design layout, consisting of HC features 22 and VC features 23. NC features 24 are also present.

In the following description, the standard lithographic convention for distinguishing "clear-field" masks and "dark-field" masks is adopted. Layout patterns denote opaque (i.e. chrome) portions of a clear-field mask, while layout patterns define open (i.e. vitreous) portions of a dark-field mask. Typically, a clear-field mask is used to pattern positive-resist (i.e. resist which becomes soluble when exposed to DUV radiation), while a dark-field mask is used to pattern negative-resist (i.e. resist which becomes insoluble when exposed to DUV radiation). In the case of positive resist, the introduction of some "shielding" becomes necessary, in order to protect VC features, when HC features are being patterned, and vice versa. The following methodology is applicable to both clear-field and dark-field masks.

Figure 5A:
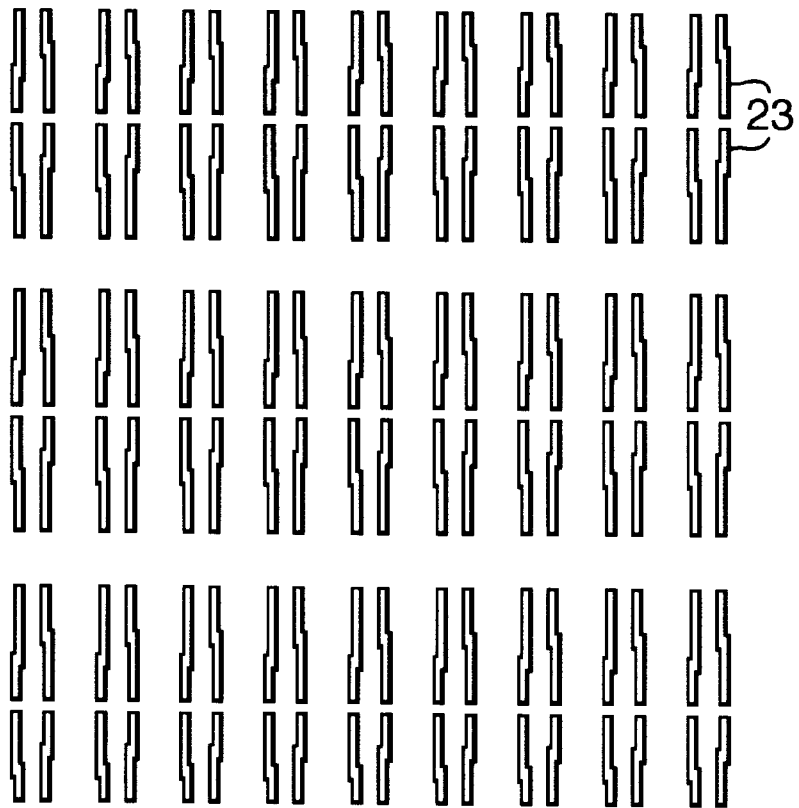
FIG. 5(a) illustrates the VC features of the design layout of FIG. 4.
Figure 5B:
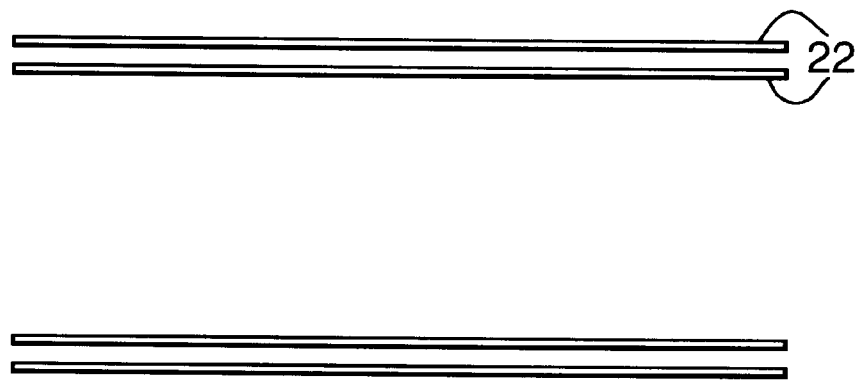
FIG. 5(b) illustrates the HC features of the design layout of FIG. 4.

As described above, the lithographic use of dipole illumination requires (in its most general implementation) two mask exposures with complementary pole orientations. In order to generate the two masks it is necessary to separate HC features 22 from VC features 23 as shown in FIGS. 5(a) and 5(b). Specifically, FIG. 5(a) illustrates the VC features 23 (i.e., the V-mask) of the design illustrated in FIG. 4, with both the HC features 22 and the NC features 24 removed. Likewise, FIG. 5(b) illustrates the HC features 22 (i.e., the H-mask) of the design illustrated in FIG. 4, with both the VC features 23 and the NC features 24 removed. It is noted that the NC features 24 of FIG. 4, which appear as square features on the horizontal and vertical features, are not depicted in either the V-mask or H-mask. In addition, neither the HC features 22 nor the VC features 23 are broken (i.e., disconnected) at the location of the NC feature 24.

Figure 6A:
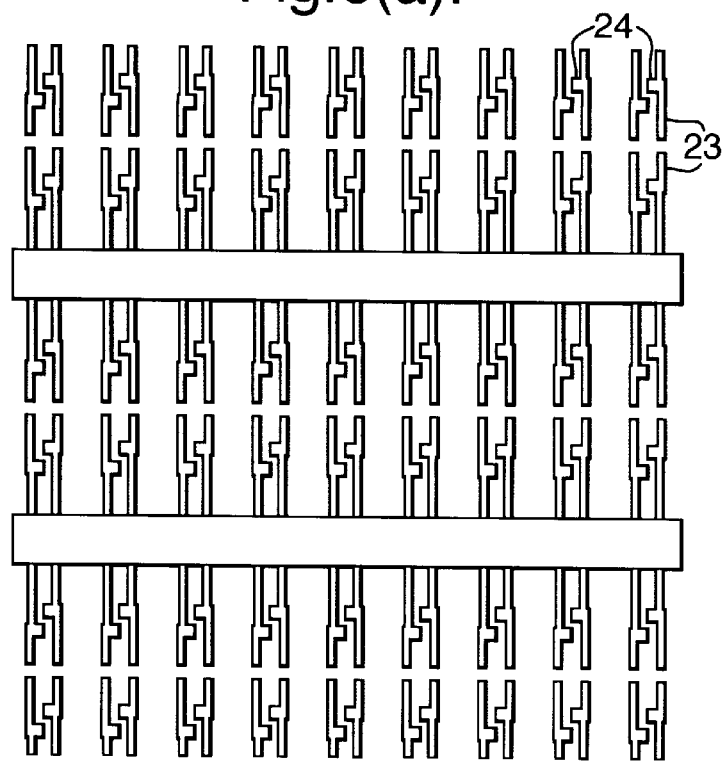
FIGS. 6(a) and 6(b) illustrate the complementary V-mask and H-mask, respectively, utilized for printing the vertical and horizontal features of the design layout of FIG. 4.
Figure 6B:
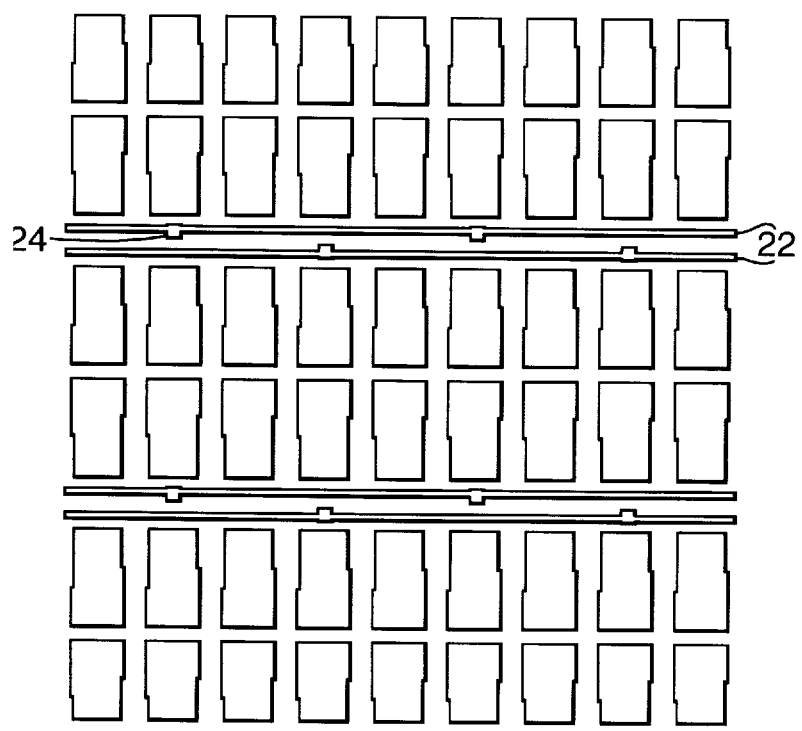

An example of complementary shielding for the V-mask and the H-mask generated from the layout illustrated in FIG. 4 is illustrated in FIGS. 6(a) and 6(b). It is noted that NC features can be placed in either mask or in both, depending on the application. FIG. 6(a) corresponds to the V-mask. As shown, in the V-mask the HC features 22 are shielded, and both the VC features 23 and the NC features 24 are not, so as to allow the VC and NC features to be printed. Similarly, referring to FIG. 6(b), which corresponds to the H-mask, the VC features 23 are shielded and the HC features 22 are not such that the HC features are printed. It is noted that the NC features are also present in the H-mask. While it is typically acceptable to include the NC features in both the V-mask and H-mask, it is also acceptable to include the NC features 24 in only one mask.

Figure 7:
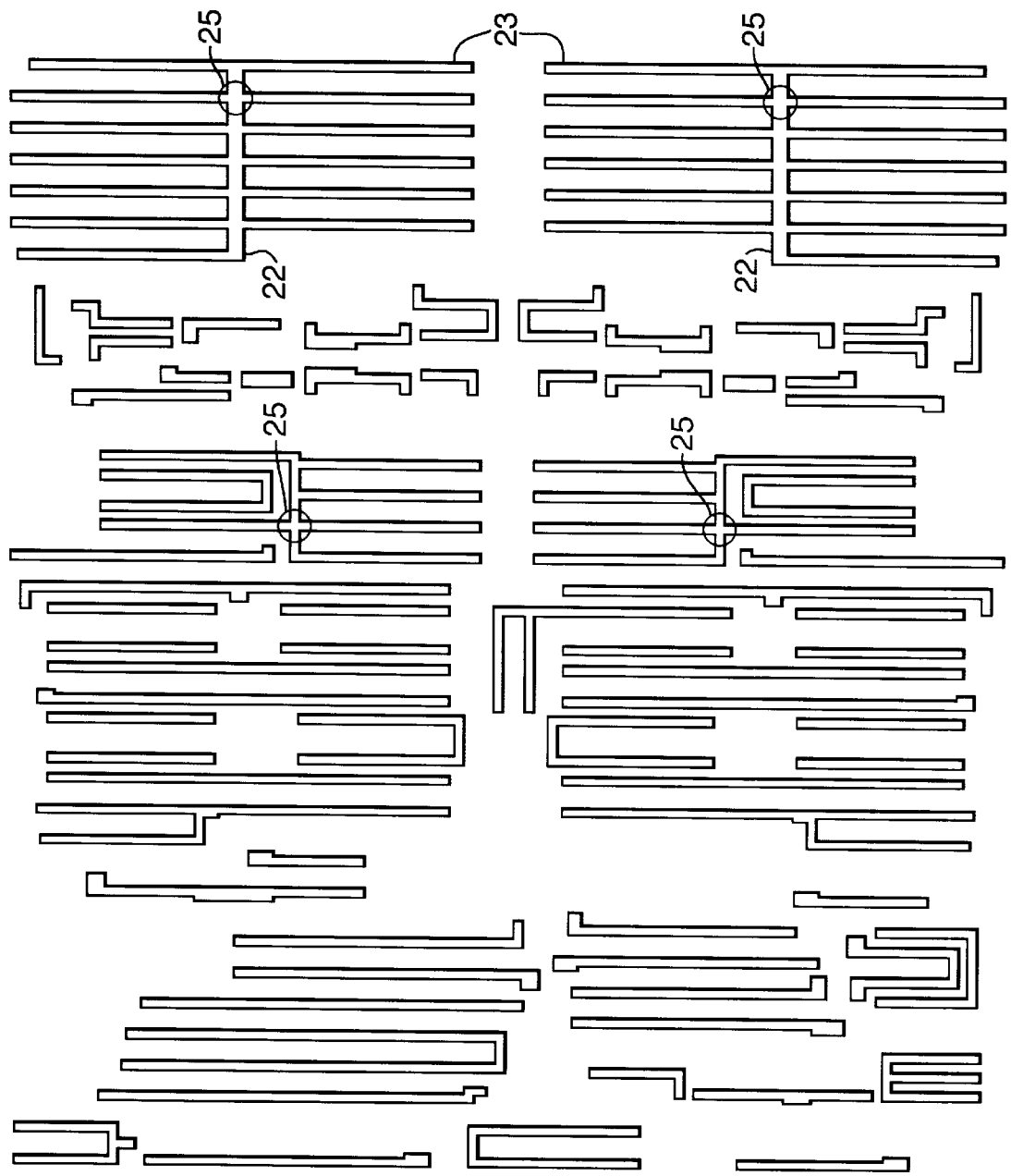
FIG. 7 illustrates a general circuit layout having numerous intersecting HC features and VC features.
Figure 8A:
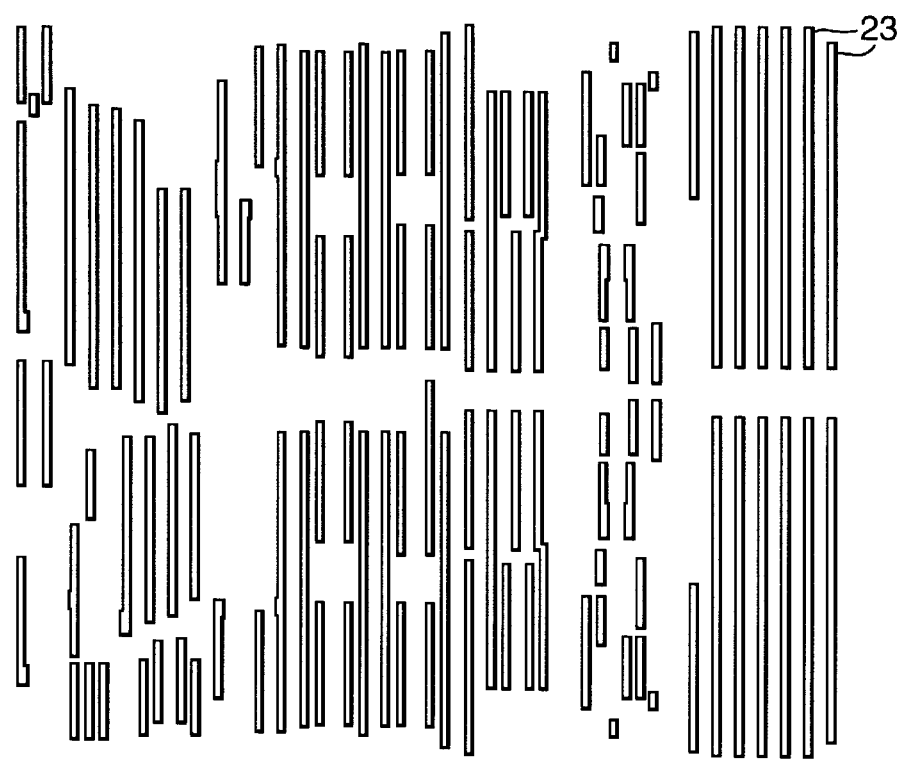
FIGS. 8(a) and 8(b) illustrate the partitioning of VC features and HC features, respectively, of the layout of FIG. 7.
Figure 8B:
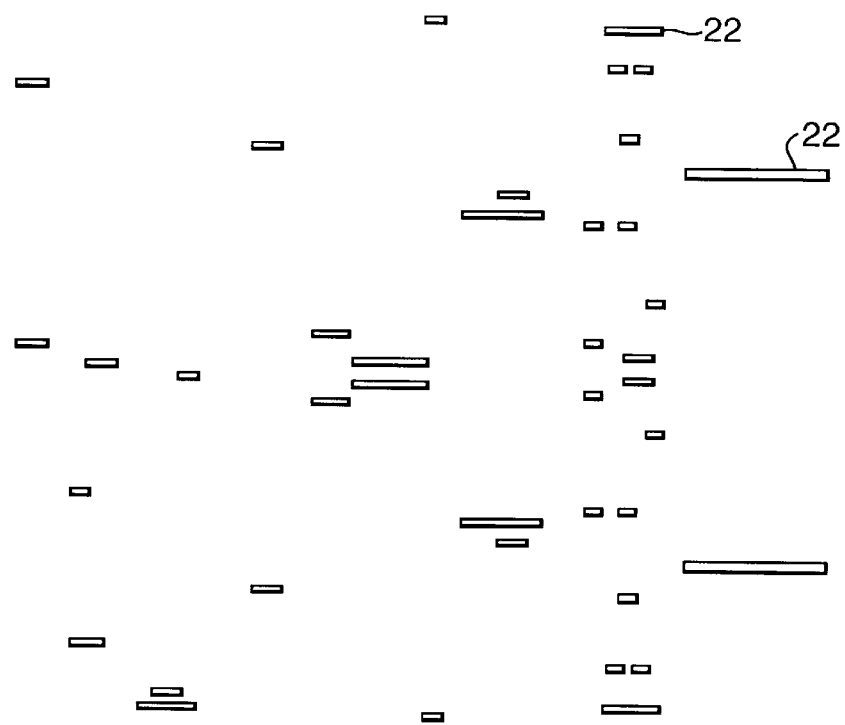
Figure 9A:
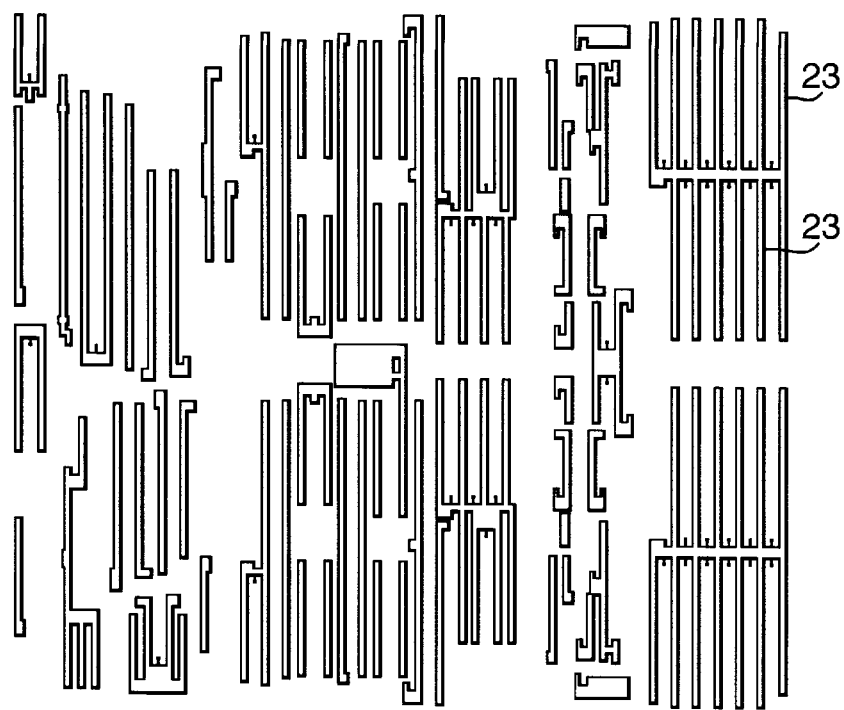
FIGS. 9(a) and 9(b) illustrate the complementary V-mask and H-mask, respectively, utilized for printing the vertical and horizontal features of the design layout of FIG. 7.
Figure 9B:
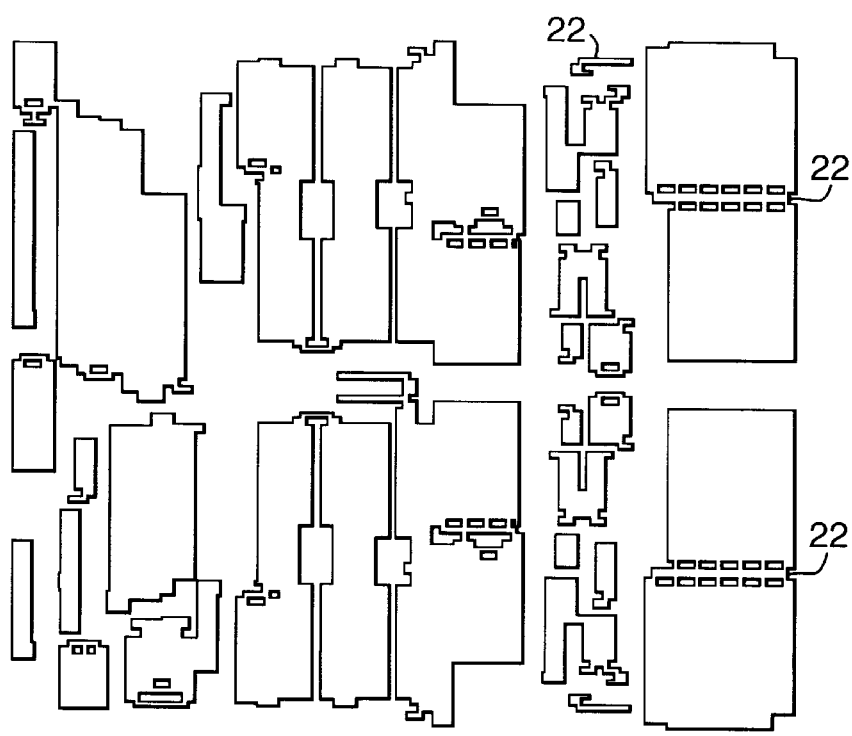

In the exemplary layout of FIG. 4, the VC features 23 and the HC features 22 are not connected (i.e., do not interconnect). A more typical layout of a general circuit (e.g., a processor-logic like circuit) is illustrated in FIG. 7. As shown, there are numerous intersections 25, or interconnections, between HC features 22 and VC features 23, which are easily identified in this layout. FIGS. 8(a) and 8(b) illustrate the partitioning of VC features 23 and HC features 22, respectively, of the layout of FIG. 7. In addition, FIGS. 9(a) and 9(b), similar to FIGS. 6(a) and 6(b), illustrate the shielding of the HC features in the V-mask and the shielding of the VC features in the H-mask, respectively.

When designing the complementary V-mask and H-mask for the case of the layout without any interconnection (or intersection) between VC and HC features such as shown in FIG. 4, the determination of the requisite shielding is a relatively straightforward process. However, when the layout includes interconnection between the VC and HC features, the design of the V-mask and H-mask becomes significantly more complicated as there generally is not a unique way of determining the exact extent of HC and VC features, as they might overlap in different ways. The present invention provides a method for generating V-masks and H-masks for any layout, including those having interconnections between HC and VC features. The novel method provides for improved reproduction of the desired layout, as well as providing another means of countering optical proximity effects.

Accordingly, the method of the present invention provides for H-V partitioning of a design layout to be utilized in conjunction with dipole illumination. As explained in more detail below, the method entails the generation of a complementary two-mask set (V-mask and H-mask), starting from a single original design layout. Each mask contains critical features in a given orientation, appropriate shielding for the complementary orientation and special geometrical modification of the features at the intersections (or interconnections) of VC and HC features. It is also permissible for the V-masks and the H-masks to contain any other type of Optical Proximity Correction (OPC) technique and/or Resolution Enhancement techniques, such as (but not limited to) scattering bars, serifs, hammerheads, phase shifting, etc.

An exemplary embodiment of the present invention is now described. It is noted that while the method entails the following steps, it is not required that the steps be performed in the listed sequence.

The first step comprises identification of substantially rectangular portions of the polygonal patterns of the design layout that are HC critical features 22. As noted above, the determination of whether a feature is a HC feature is based on predefined criteria, such as, the CD obtainable with the given lithography process/system and/or geometry specific criteria, such as, aspect ratio, threshold difference, absolute value of width and height, etc.

The second step in the process comprises identification of substantially rectangular portions of the polygonal patterns of the design layout that are VC features 23. As with HC features, determination of VC features is based on predefined criteria, such as, the CD obtainable with the given lithography process/system and/or geometry specific criteria, such as, aspect ratio, threshold difference, absolute value of width and height, etc. As noted above, one exemplary rule for determining whether or not a given feature is a HC feature is that any polygon whose height is approximately 2 or more times greater than the minimum CD is classified as a HC feature. Similarly, one exemplary rule for determining whether or not a given feature is a VC feature is that any polygon whose width is larger than the minimum CD is classified as a VC feature. It is noted that the reason for the foregoing minimum dimension requirement is because as the method of the present invention may result in the widening or reduction of feature width (or height), it is necessary for the features to have a certain minimum width (or height) greater than the CD in order for the method to be effective.

The third step in the process comprises identification of interconnection (ITC) portions of the polygonal patterns (i.e., identification of the edges, or portions of the edges, or portions of polygons, at the intersection areas of the layout). It is noted that typically any portion of a VC feature that contacts a HC feature (and vice versa) constitutes an interconnection portion (ITC). It is also noted that if a VC feature or a HC feature contacts a NC feature, typically, this area is treated as an ITC portion. Once the VC features, the HC features and ITC features are identified, the remaining portions of the layout are identified as non-critical (NC) portions. It is noted that in the preferred embodiment of the present invention, all interconnections are treated. However, it is noted that for a given interconnection, it is possible for the treatment to be zero, which results in no change in the given interconnection.

Next, for each feature in the HC, VC, and ITC categories defined above, the lithographic or proximity environment (which is referred to as a proximity cluster, $PE_i$) must be defined. In other words, for each HC, VC and ITC feature, the design layout must be analyzed to determine how the feature is positioned relative to neighboring elements. Items to be included when determining the proximity cluster for a given feature include, for example, but are not limited to, line/space ratio, pitch, neighboring right/left spaces, first/second closest edge, etc. It is noted that additional aspects of the design may be considered when determining the proximity cluster for a given feature.

Once the proximity cluster, $PE_i$ (also referred to as a proximity environment) is defined for each feature, the next step in the process is to generate an edge modification plan for each ITC feature. As explained below in more detail, the edge modification plan is based on application-specific rules predicated on 12 parameters, which are defined below. To summarize, the edge modification plan for a given ITC feature (e.g., between a vertical feature and a horizontal feature) details how the portion of the V-mask corresponding to the vertical feature corresponding to the given interconnection area should be adjusted, as well as how the portion of the H-mask corresponding to the horizontal feature corresponding to the given interconnection area should be adjusted, so that upon printing both the V-mask and the H-mask, the resulting interconnection area is an accurate reproduction of the original design layout.

The next step is to generate complementary shielding plans for the VC features and the HC features based on the same application-specific rules utilized to generate the edge modification plan for the ITC features. In other words, when generating the V-mask for printing VC features, the application-specific rules are utilized to determine the shielding necessary for each HC feature. Similarly, when generating the H-mask for printing HC features, the application-specific rules are utilized to determine the shielding necessary for each VC feature.

The next step in the process is the generation of the V-mask and the H-mask. The V-mask is generated by assembling the VC features, the vertical portions of ITC features, which have been subjected to the edge modification plan, and the shielded HC features. Similarly, the H-mask is generated by assembling the HC features, the horizontal portions of ITC features, which have been subjected to the edge modification plan, and the shielded VC features.

Once the V-mask and H-mask are generated, the layout is printed on the wafer by exposing the V-mask and thereafter exposing the H-mask in accordance with standard dipole illumination techniques.

As noted above, the basis of the edge modification plan, which functions to adjust the ITC areas in both the V-mask and the H-mask such that the final pattern printed on the wafer accurately represents the original layout, comprises in the given embodiment the assignment of a set of 12 values, referred to as the primary parameters (PPik), which control the portions of edges at the intersection areas between horizontal and vertical features. In other words, the primary parameters detail how a given edge of a feature should be modified (e.g., shifted left, shifted right, shifted up, or shifted down). As explained below, the values of the 12 primary parameters vary in accordance with the particular proximity conditions of a given feature and variations in the given lithographic and process conditions. The 12 primary parameters for the geometric modification of the features are:

H-Mask Modifications:
$W_{LH}$: left widening for the H-Mask
$D_{LH}$: left deepening for the H-Mask
$W_{RH}$: right widening for the H-Mask
$D_{RH}$: right deepening for the H-Mask
$S_{LH}$: left shielding for the H-Mask
$S_{RH}$: right shielding for the H-Mask V-Mask Modifications:
$W_{LV}$: left widening for the V-Mask
$D_{LV}$: left deepening for the V-Mask
$W_{RV}$: right widening for the V-Mask
$D_{RV}$: right deepening for the V-Mask
$S_{LV}$: left shielding for the V-Mask
$S_{RV}$: right shielding for the V-Mask As stated, the value of each of the foregoing parameters will vary in accordance with each varying proximity cluster as well as variations in the chosen lithographic and process conditions. It is further noted that the present invention can be practiced utilizing a subset of the 12 parameters listed above. In other words, it is possible that some of the 12 parameters have a value of zero for a given modification plan.

While a detailed method of determining the primary parameter values for a given proximity cluster and a general set of lithographic process conditions is set forth below, as a general rule:

$PP_{ik} = f_{ik}(\lambda, NA, Illumination, CD, Pitch, etc.) [k=1 \ldots 12]$
[i∈{set of proximity clusters}]

where $f_{ik}$ are (in the general case) independent functions, and $\lambda$ is the wavelength of the illumination source (e.g., 248 nm, 193, nm, 157 nm, etc.), NA is the Numerical Aperture of the projection lens, illumination is dependent on the $\sigma_{in}$, $\sigma_{out}$ and $\theta$ of the dipole source (or other equivalent illumination parameters), CD is the targeted critical dimension, etc., and Pitch corresponds to the distance between the corresponding features.

Figure 10A:
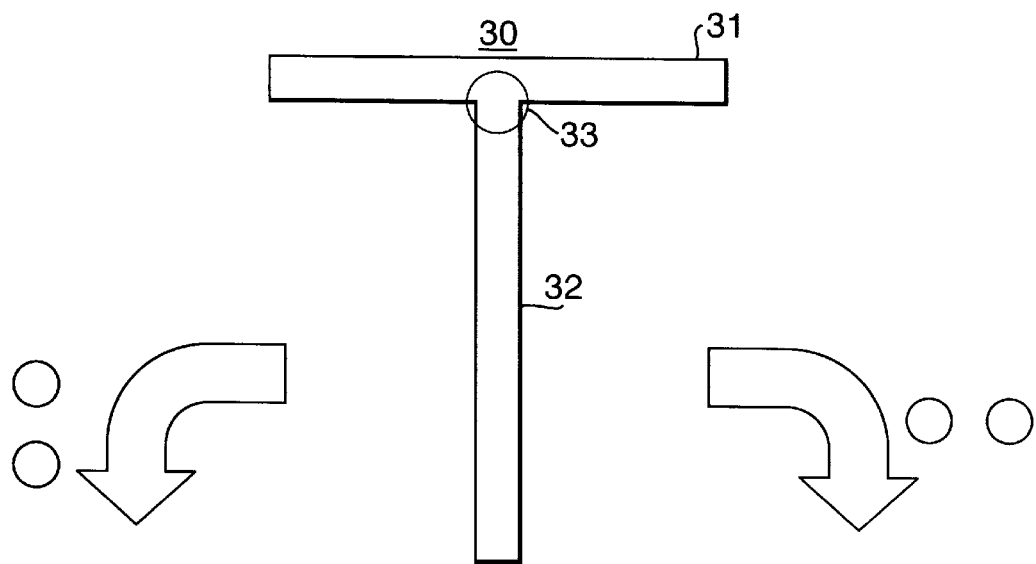
FIGS. 10(a)–10(c) illustrate an exemplary "T" shaped layout feature and the decomposition of the "T" shaped layout feature into a V-Mask and H-Mask in accordance with the method of the present invention.
Figure 10B:
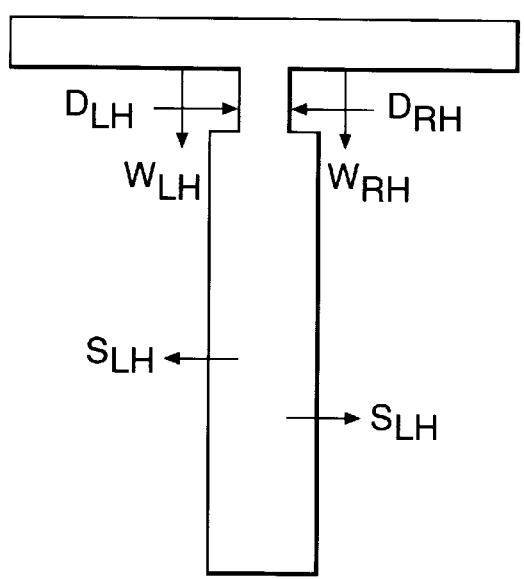
Figure 10C:
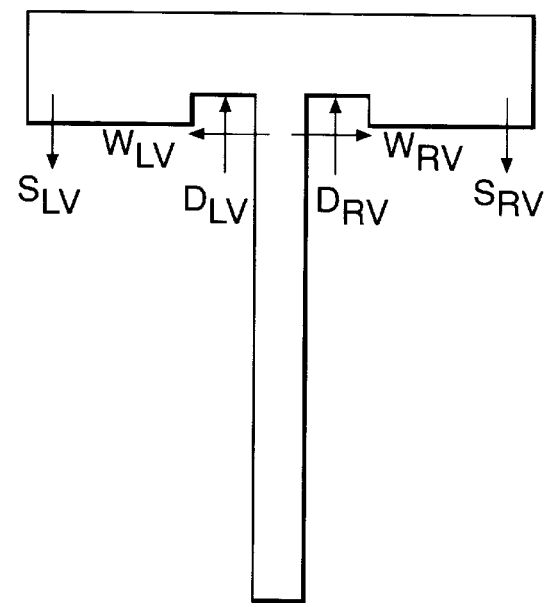

FIGS. 10(a)–10(c) illustrate a "T" shaped layout feature and the decomposition of the "T" shaped layout feature into a V-mask and H-mask in accordance with the method of the present invention. More specifically, FIG. 10(a) illustrates the exemplary "T" shaped feature 30 for which the V-mask and the H-mask will be generated. The "T" shaped feature has a horizontal critical feature 31 and a vertical critical feature 32, which intersect to create an ITC feature 33. It is noted that both feature 31 and feature 32 are deemed "critical" because the height of feature 31 and the width of feature 32 are both greater than twice the minimum CD. FIG. 10(b) illustrates the H-mask generated by the method of the present invention. Referring to FIG. 10(b), in the H-mask, the horizontal feature 31 (i.e., the top portion of the "T") is critical. As such, the height of the horizontal feature is adjusted in accordance with the values of the primary parameters $W_{LH}$ and $W_{RH}$, which are determined as a function of the proximity cluster associated with feature 31 and the given photolithography system being utilized. It is noted that the value of parameters $W_{LH}$ and $W_{RH}$, and all other parameters, are independent of one another and are not necessarily equal (i.e., the adjustment to the left side of the feature can be different from the adjustment to the right side of the feature). The vertical feature 32 in the H-mask is protected by shielding as defined by primary parameters $S_{LH}$ and $S_{RH}$. The values of $S_{LH}$ and $S_{RH}$ define the extent of the shielding of the vertical feature 32, and as stated above, $S_{LH}$ and $S_{RH}$ are defined as a function of the proximity cluster associated with feature 32 and the given photolithography system being utilized. Finally, a notch is generated at the intersection area 33 as defined by $D_{LH}$ and $D_{RH}$. The notch, as shown in FIG. 10(b), represents a reduction in the area to be printed by the H-mask in the intersection area 33.

Now referring to FIG. 10(c), similar to the H-mask, in the V-mask, the vertical feature 32 (i.e., the vertical portion of the "T") is critical. As such, the width of the vertical feature is adjusted in accordance with the values of the primary parameters $W_{LV}$ and $W_{RV}$, which are determined as a function of the proximity cluster associated with feature 32 and the given photolithography system being utilized. It is again noted that the value of parameters $W_{LV}$ and $W_{RV}$, and all other parameters, are independent of one another. The horizontal feature 31 in the V-mask is protected by shielding as defined by primary parameters $S_{LV}$ and $S_{RV}$. The values of $S_{LV}$ and $S_{RV}$ define the extent of the shielding of the horizontal feature 31, and as stated above, $S_{LV}$ and $S_{RV}$ are defined as a function of the proximity cluster associated with feature 31 and the given photolithography system being utilized. Finally, another notch is generated at the intersection area 33 as defined by $D_{LV}$ and $D_{RV}$. As shown in FIG. 10(c), once again the notch represents a reduction in the area to be printed by the V-mask in the intersection area 33.

As a result of the modification of the H-mask and V-mask in accordance with the primary parameters as set forth above, the original layout including the intersection areas, is accurately reproduced upon exposing the H-mask and V-mask in accordance with standard dipole processing.

There are multiple methods for determining the values of the primary parameters, which define the optimal variations (i.e., adjustments in widening, deepening and shielding values) of the H-mask and V-mask. One such approach involves the determination of a factor referred to the Normalized Area Error (NAE).

In general, the pattern fidelity of a given design becomes critical as sub-wavelength processes are utilized in production. NAE is essentially an extension to the 2-dimensional realm from the traditional approach of measuring only the critical dimension (which is a 1-dimensional metric).

Figure 11:
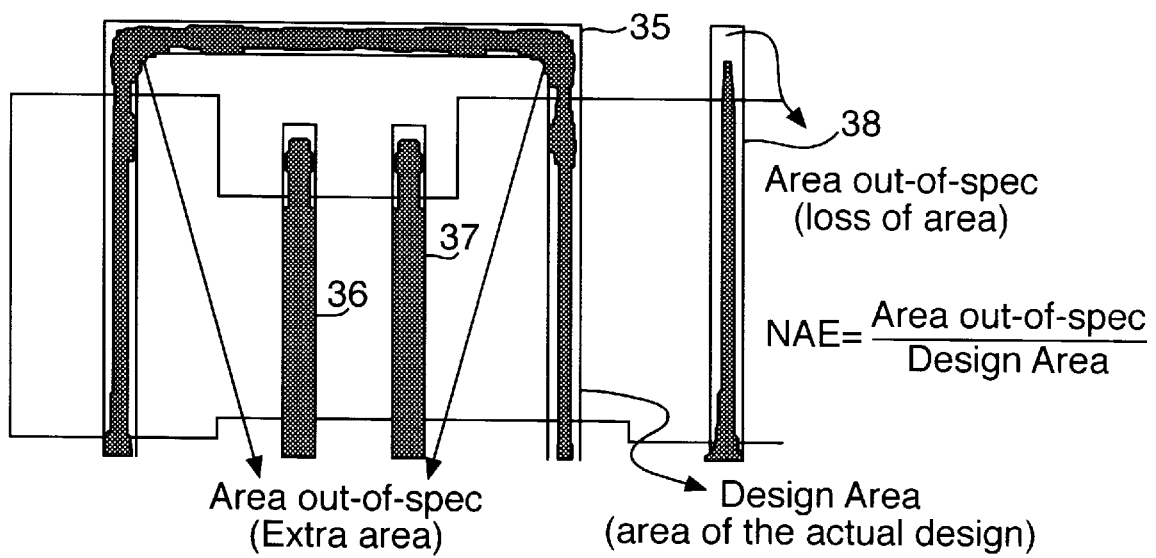
FIG. 11 illustrates exemplary features having areas which are "out-of-spec".

NAE can be defined as the "area-out-of-spec" over the given design area. Both an area that exhibits lack of coverage and an area that exhibits excess coverage is considered an area-out-of-spec. FIG. 11, which illustrates four distinct features 35, 36, 37 and 38, is instructive in understanding the meaning of an "area-out-of-spec". For example, feature 35 exhibits excess coverage in both corners because the resulting layout printed on the wafer extends beyond the original layout design. Feature 38 illustrates an area-out-of-spec due to lack of coverage. Both lack of coverage areas and excess coverage areas are included when computing the NAE. As stated above:

NAE=(total area out of spec)/(total design area).

It is noted that every set of process conditions has a single value of normalized area error. The NAE calculation can also be targeted to specific regions within a given design. This targeting of the NAE calculation to a specific area of the design is utilized when computing the primary parameters utilized to modify the V-mask and H-mask in accordance with the present invention.

More specifically, in accordance with one embodiment of the present invention, only regions within 2*α of critical vertical and horizontal features, including intersection areas, are sampled, and their NAE calculated, where α corresponds to the resolution and is defined by the standard equation:

$$\alpha=(k_1\lambda)/NA$$

where k1 equals a process specific constant, λ is the wavelength of the illumination source and NA equals the numerical aperture of the projection lens.

The computed data regarding the NAE values can be placed on a focus-exposure matrix in a manner similar to the same way CD data is plotted in the so-called Bossung Plots. The information that is derived from the focus-exposure matrix is utilized to identify the optimal set of lithographic parameters for a given pattern design, subject to any decomposition or advanced mask process (multiple exposures, alternating phase shift masks, attenuated phase shift masks, dipole decomposition, pitch decomposition, etc.).

Figure 12:
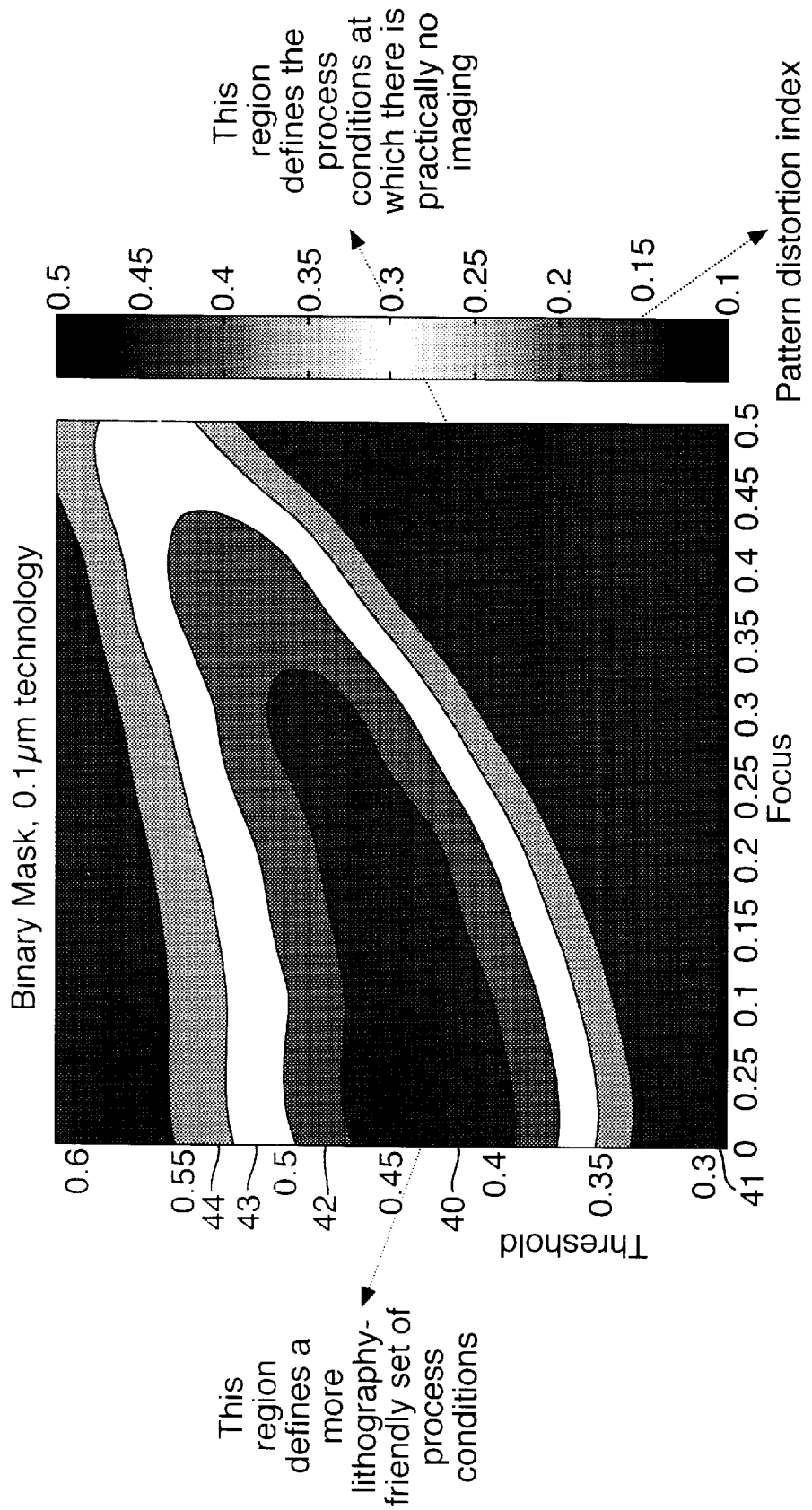
FIG. 12 illustrates an exemplary pattern distortion map.

FIG. 12 illustrates an exemplary region that can be considered to be the optimal process condition set for the given design and it also illustrates how the image is degraded when departing from the optimal dose and focus values. Referring to FIG. 12, which is a pattern distortion map, the darkest region 40 defines the optimal set of process conditions, while the outer region 41 defines process conditions for which there is substantially no imaging. The regions 42, 43, 44 in between region 40 and region 41 define progressively degrading process conditions, as the region move further away from region 40.

Once a metric has been defined (e.g., normalized area error (NAE) or critical dimension measurements (CD)), it is a matter of determining the best combination of primary parameters (i.e., the widening, deepening and shielding) values for a given design decomposition. FIG. 13 illustrates how for a different set of pupil shapes and decomposition values the pattern distortion map of FIG. 12 changes indicating the robustness of the decomposition. By simple inspection or by calculating the maximum overlapping process window from such maps as shown in FIG. 13, it is possible to infer the best set of widen, deepen and shielding values.

Referring to FIG. 13, it is noted that a more "robust decomposition" will maintain the dark regions during variations in illumination conditions (e.g., pupil shape, dose, focus, etc.). Decomp. 4 of FIG. 13 illustrates such a robust decomposition. In contrast, Decomp. 1 of FIG. 13, while acceptable for a particular subset of conditions, it is not optimal for a wide range of condition. Accordingly, a robust decomposition is one that introduces minimal amounts of variation when the process conditions shift from the desired/optimal value.

In order to determine the most "robust decomposition", the area of the dark region of each decomposition is computed to determine which decomposition contains the largest amount of area of dark region. In the given embodiment, dark regions are defined as an area that corresponds to a NAE in the range from 0–0.1. It is noted that the larger the dark region of a given decomposition, the smaller the NAE. It is noted that ideally, NAE would be made equal to zero, however, this is not possible due to process limitations. In addition, the NAE is calculated for each focus, exposure and pupil shape condition. In the given example, each map is made up of approximately 200 NAE calculations.

It is also noted that the foregoing approach can be based on simulations or experiments, and the results will vary depending on the optical proximity environment and the actual process conditions (film stack, lens aberrations, etch process, etc.)

Following the methodology set forth above, it is possible to construct a table as shown in FIG. 14 that defines one set of optimal proximity parameters to be utilized in adjusting the VC, HC and ITC features in both the V-mask and H-mask. These starting values for the proximity parameters assume that there are no assist features present in the decomposition.

Referring to FIG. 14, it is noted that the starting values set forth therein have been computed for notch style partitioning. In addition, the value of the adjustment is dependent on whether or not the feature is located in a dense, semi-dense, semi-isolated or isolated environment, as well as whether or not the interconnection is between two critical feature, a critical and a non-critical feature or two non-critical features (respectively, C-C, C-nC and nC-nC). Further, the values $P_S$, $P_W$ and $P_D$ in FIG. 14 represent the shielding, widening and deepening of the given feature.

It is noted that, typically, in order to have a production-worthy decomposition, further OPC and reticle enhancement techniques need to be used in order to maximize the final yield of the process. However, utilizing the foregoing methodology, one is able to derive initial pattern decomposition parameters that do not significantly vary from the optimal values, thus ensuring the accuracy and robustness of the pattern transfer.

It is further noted that the initial parameters set forth in FIG. 14 are in no way intended to be the optimal values for every process available today, but rather an example of one method of the process to follow in order to determine the best set of initial parameters for the specified dipole decomposition.

Figure 15A:
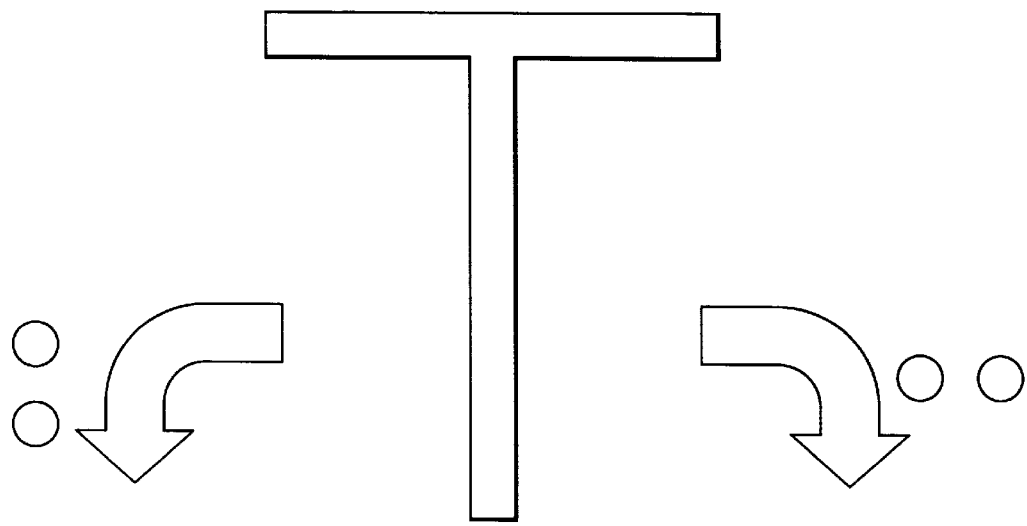
FIGS. 15(a)–15(c) illustrate an exemplary "T" shaped layout feature and the decomposition of the "T" shaped layout feature into a V-Mask and a H-Mask in accordance with the method of the present invention utilizing the "trench" style partitioning.
Figure 15B:
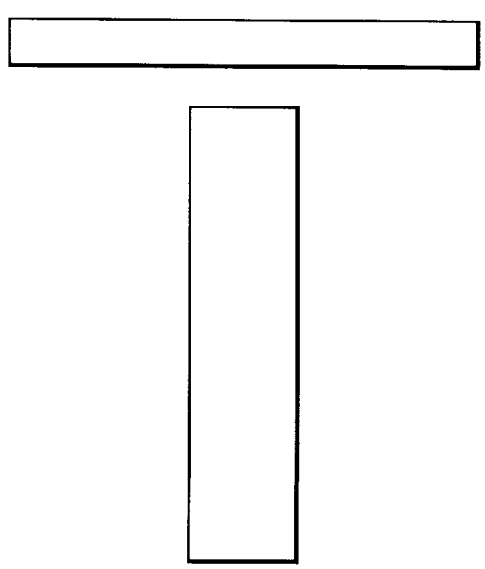
Figure 15C:
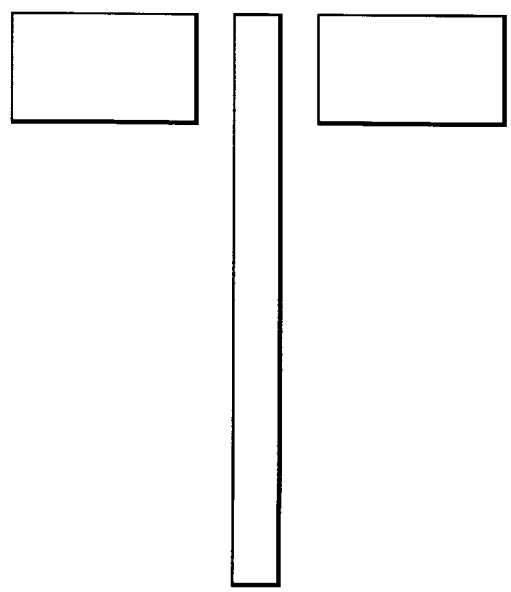

The partitioning style implemented in the generation of the V-mask and the H-mask of FIGS. 10(b) and 10(c) is referred to "notch style", due to the notches formed around the intersectional areas. However, by an appropriate adjustment of the $W_{XY}$ and $D_{XY}$ parameters, another partitioning style can also be generated as depicted in FIGS. 15(b)–15(c), which is referred to as "trench style". Referring to FIGS. 15(a)–15(c), FIG. 15(a) illustrates a "T" shaped feature to be decomposed into a H-mask and a V-mask. However, in contrast to the H-mask of FIG. 10(b) which comprises a notch formed by adjustment of $D_{LH}$ and $D_{RH}$, in the H-mask illustrated in FIG. 15(b), the parameters $D_{LH}$ and $D_{LR}$ are selected such that a trench is formed in the intersection area. Similarly, in the V-mask shown in FIG. 15(c), a trench is formed in the intersection area by adjustment of primary parameters $D_{LV}$ and $D_{RV}$.

Figure 16A:
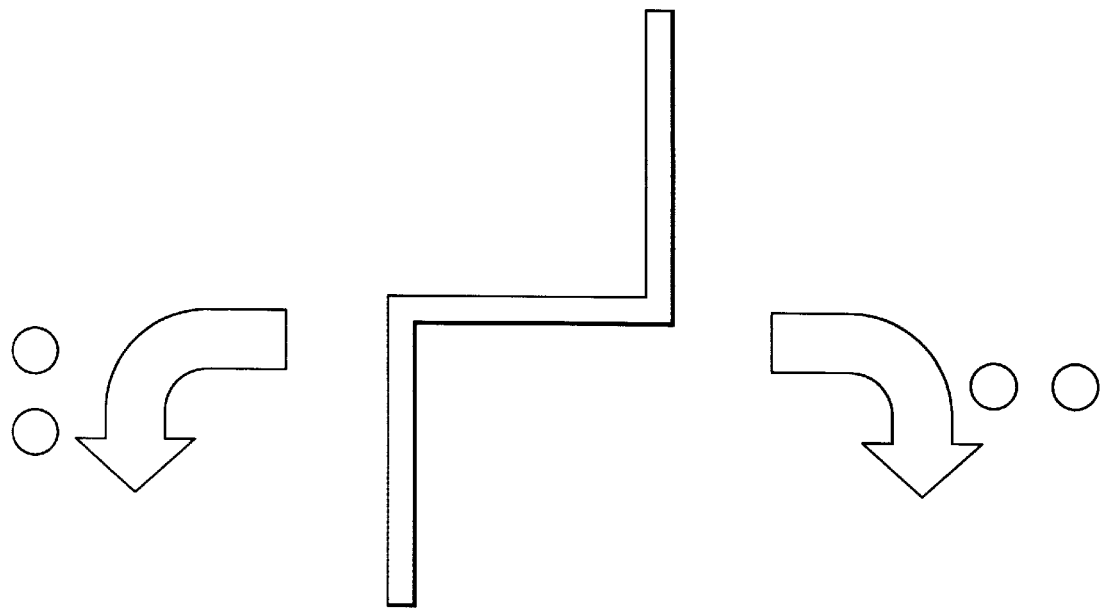
FIGS. 16(a)–16(c) illustrate a "notch" style partitioning for a double-joint feature.
Figure 16B:
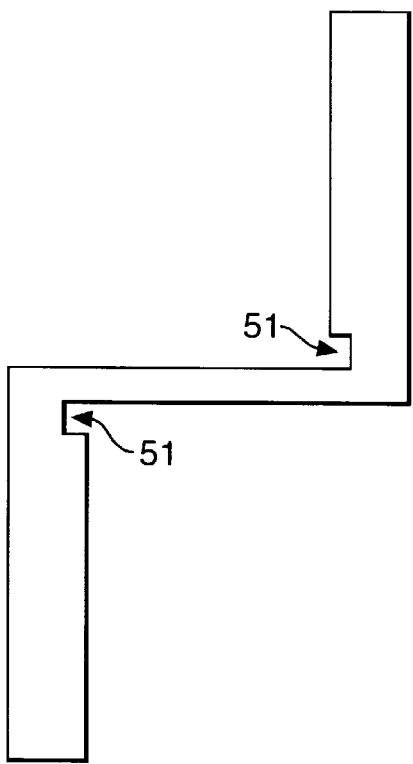
Figure 16C:
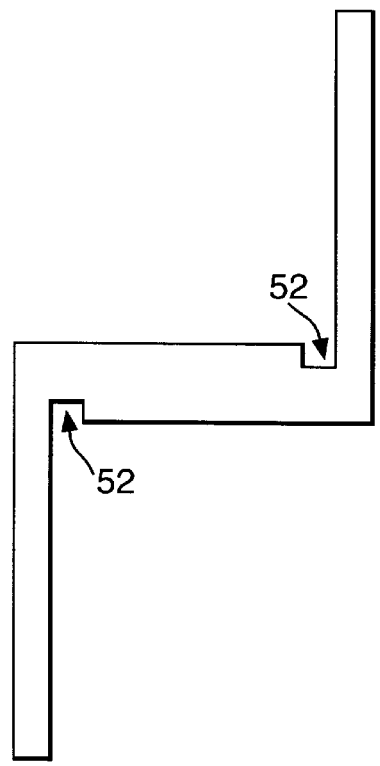
Figure 17A:
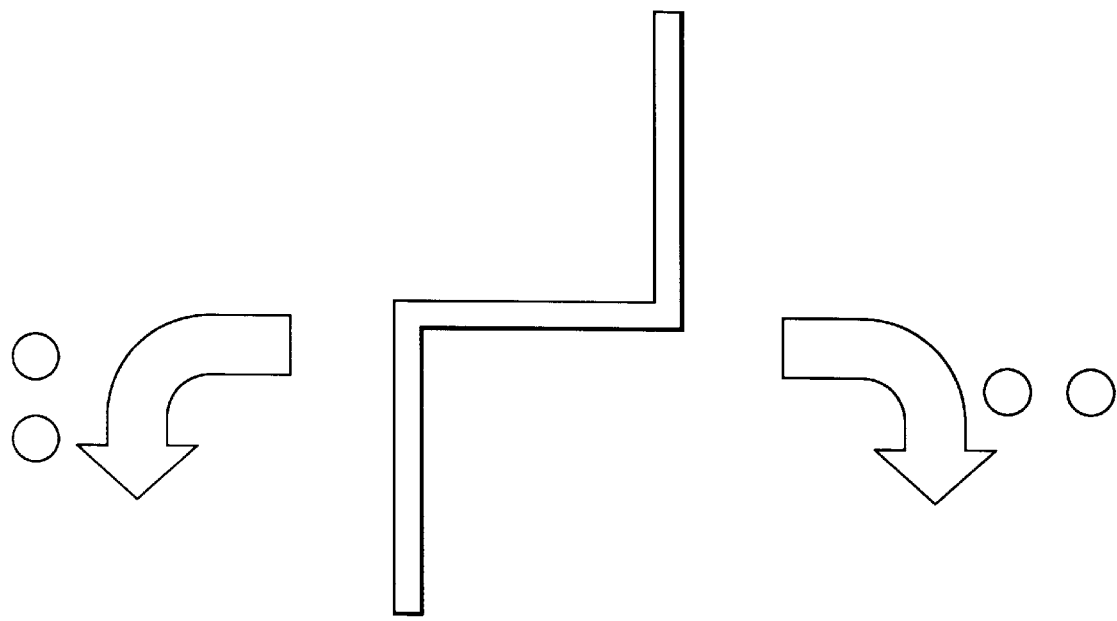
FIGS. 17(a)–17(c) illustrate the partition of the same double-joint feature as illustrated in FIG. 16(a), with the exception that "trench" style partition is utilized.
Figure 17B:
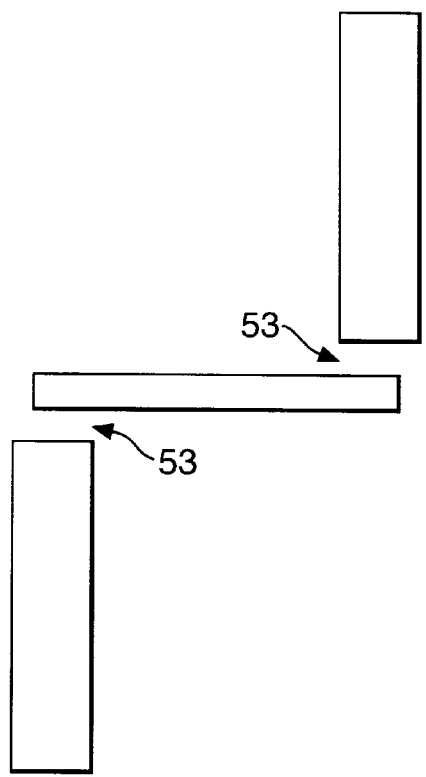
Figure 17C:
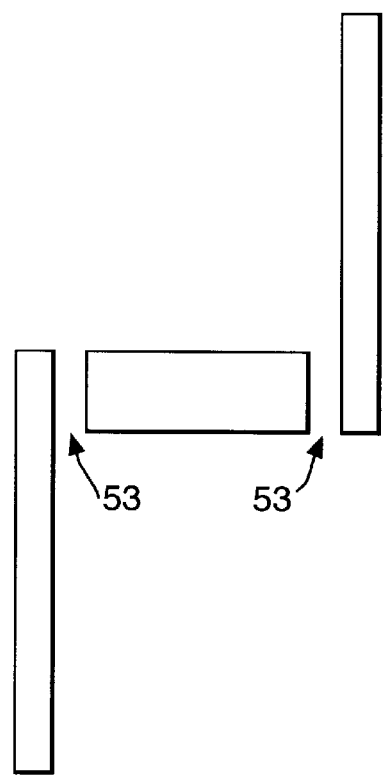

As stated above, the present invention can be utilized to adjust the H and V masks for substantially any intersectional area utilizing 12 primary parameters. For example, FIGS. 16(a)–16(c) illustrate a notch style partitioning for a double-joint feature. Specifically, FIG. 16(a) illustrates the double-joint feature to be partitioned in a V-mask and a H-mask. FIG. 16(b) illustrates the resulting H-mask, having notches 51, and FIG. 16(c) illustrates the resulting V-mask, having notches 52. FIGS. 17(a)–17(c) illustrate the partition of the same double-joint feature as illustrated in FIG. 16(a), with the exception that the trench style partition is utilized. As a result, as shown in FIGS. 17(b) and 17(c), respectively, the resulting H-mask and V-mask comprise trenches 53.

Figure 18A:
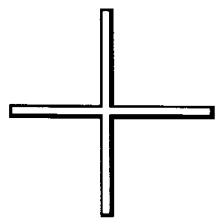
FIGS. 18(a)–18(o) illustrate exemplary features and their corresponding H-mask and V-mask generated utilizing the "notch" style partitioning of the present invention.
Figure 18B:
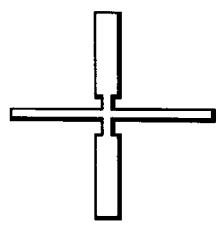
Figure 18C:
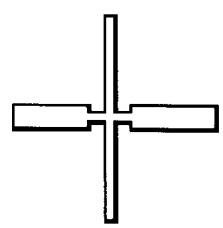
Figure 18D:
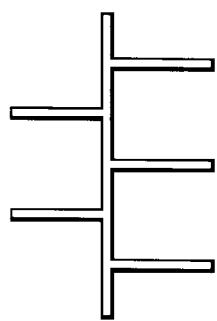
Figure 18E:
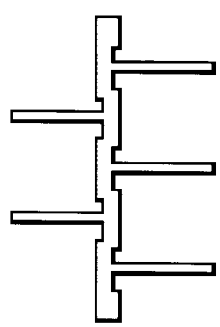
Figure 18F:
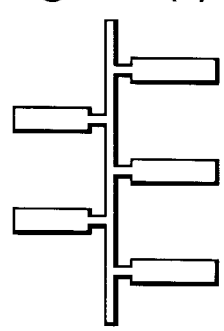
Figure 18G:
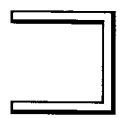
Figure 18H:
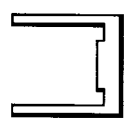
Figure 18I:
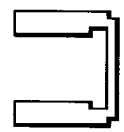
Figure 18J:
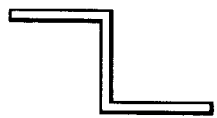
Figure 18K:
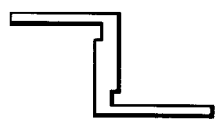
Figure 18L:
Figure 18M:
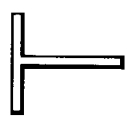
Figure 18N:
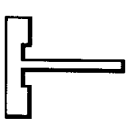
Figure 18O:
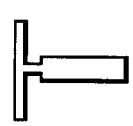
Figure 19A:
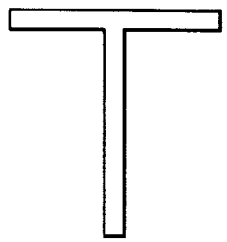
FIGS. 19(a)–19(i) illustrate hybrid partitioning styles, including both "notch" and "trench" style partitioning.
Figure 19B:
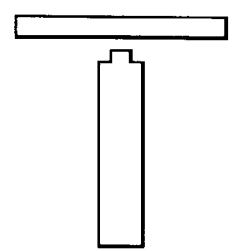
Figure 19C:
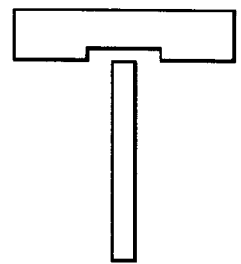
Figure 19D:
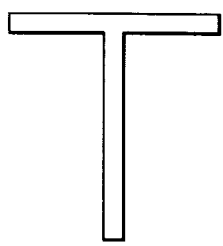
Figure 19E:
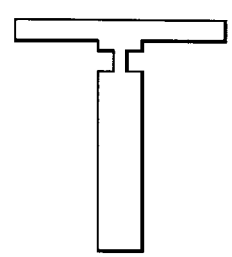
Figure 19F:
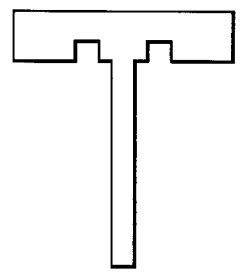
Figure 19G:
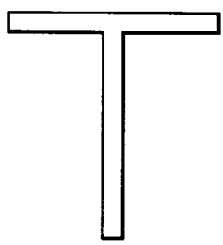
Figure 19H:
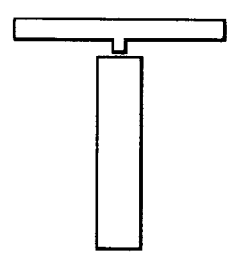
Figure 19I:
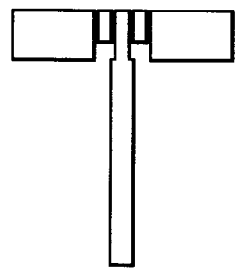
Figure 22A:
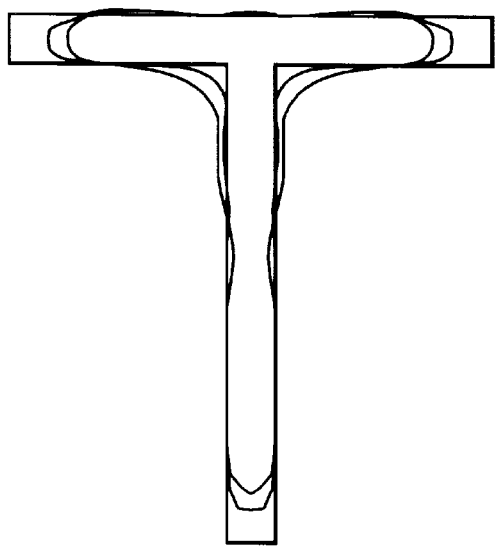
FIGS. 22(a)–22(d) illustrate exemplary aerial image simulations utilizing non-optimal proximity parameters.
Figure 22B:
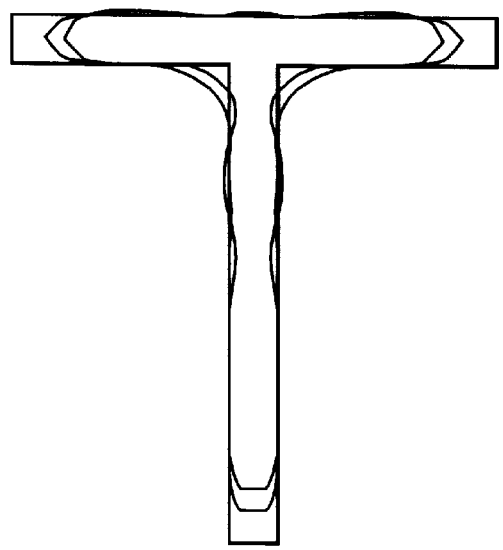
Figure 22C:
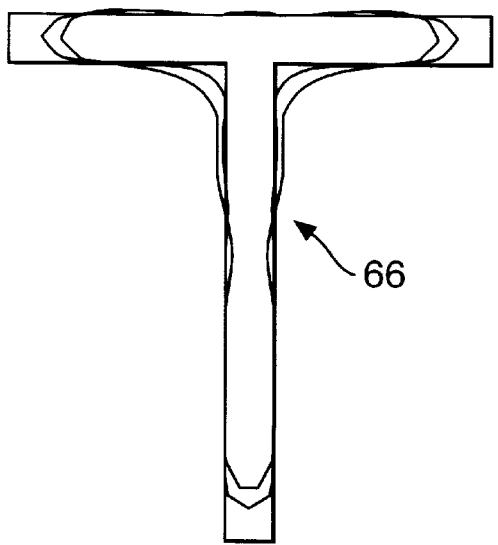
Figure 22D:
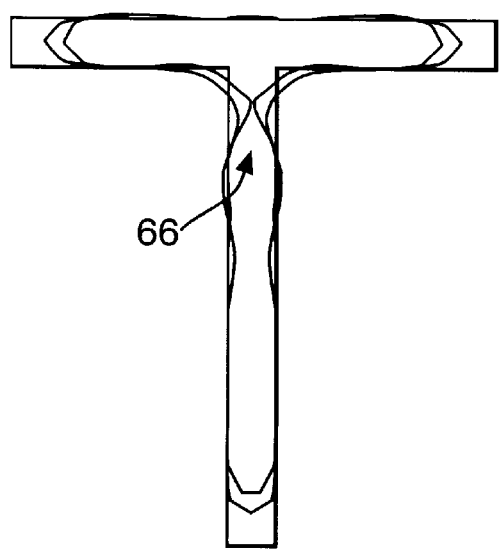

Indeed, any given shape present in any general design layout can be partitioned using the 12 primary parameters in accordance with the method of the present invention. FIGS. 18(a)–18(o) illustrate additional exemplary features and their corresponding H-mask and V-mask, which are generated utilizing the "notch" style partitioning of the present invention. Specifically, FIGS. 18(a), (d), (g), (j) and (m) illustrate features to be partitioned, FIGS. 18(b), (e), (h), (k) and (n) represent the corresponding H-mask, respectively, and FIGS. 18(c), (f), (i), (l) and (o) represent the corresponding V-mask, respectively.

It is also possible to implement hybrid partitioning styles (e.g. notch and trench partitioning) as illustrated in FIGS. 19(a)–19(i). Specifically, FIGS. 19(a), (d) and (g) illustrate features to be partitioned, FIGS. 19(b), (e) and (h) represent the corresponding H-mask, respectively, and FIGS. 19(c), (f) and (i) represent the corresponding V-mask, respectively.

It is noted that although the method of the present invention has been illustrated above by partitioning of various isolated features, it is also applicable to lines and spaces intersecting in any given way, with any given pitch ratio. For example, FIGS. 20(a)–20(c) and FIGS. 21(a)–21(c) represent a notch style partitioning and a trench style partitioning, respectively, for a 7-line comb pattern.

Simulation work has also been performed in order to assess the patterning performance/improvement resulting from use of the present invention. FIGS. 22(a)–22(d) illustrate aerial image simulations utilizing non-optimal proximity parameters. As illustrated, strong pattern distortions 66 exist even though high resolution patterning can still be achieved.

Figure 23A:
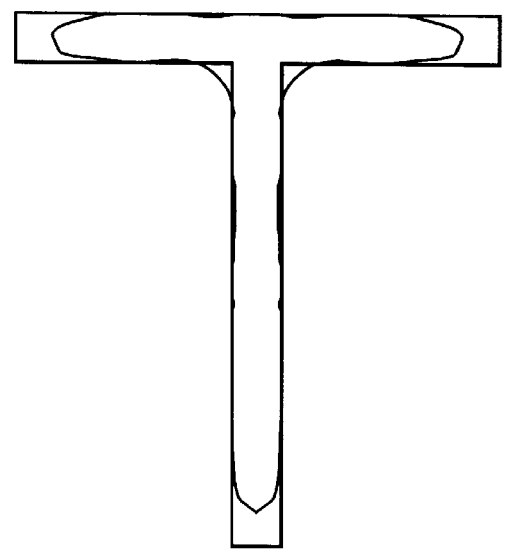
FIGS. 23(a)–23(b) illustrate exemplary aerial image simulations utilizing optimal proximity parameters determined in accordance with the present invention.
Figure 23B:
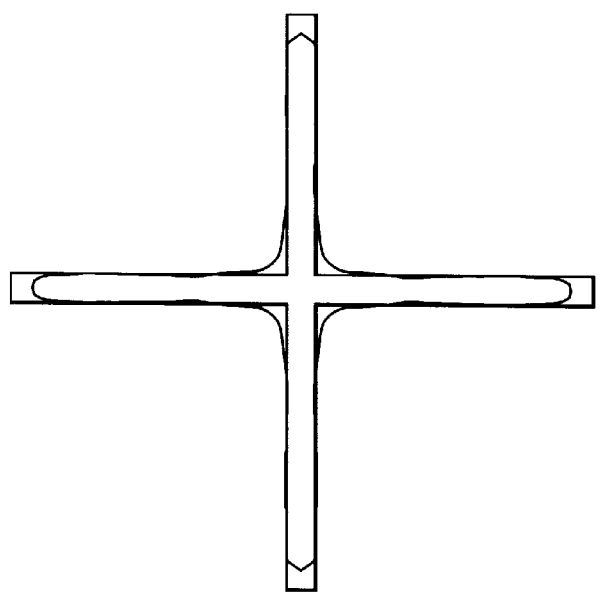
Figure 24:
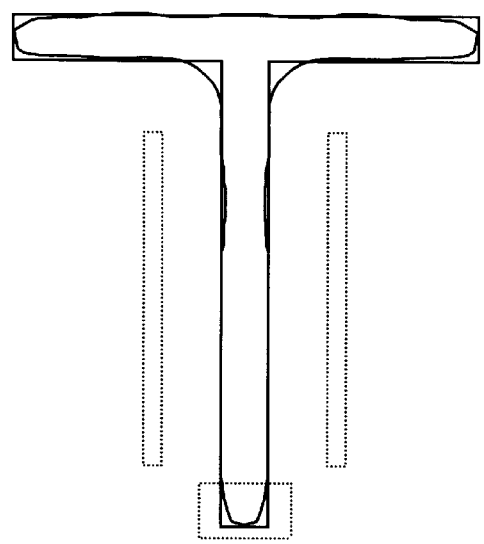
FIG. 24 provides an example of how additional OPC techniques can be utilized with the method of the present invention.

In contrast, by optimizing the individual primary parameter sets (i.e., widening, deepening and shielding), an improved printability and pattern fidelity can be obtained as depicted in FIGS. 23(a) and 23(b) for a "T" shaped feature and a "cross" shaped feature, respectively. It is also noted that line-end corrections and additional OPC techniques, such as scattering bars, can be utilized and provide a completely manufacturable solution, as is illustrated in FIG. 24. In fact, the selection of the primary parameters can also be utilized to effect OPC.

It is noted that the dipole partitioning method of the present invention has been implemented using the Calibre CAD tool (by Mentor-Graphics). The method of the present invention can obviously be implemented on any other type of CAD tool, with different degrees of performance (from the point of view of computational speed and data file size). The choice of Calibre was motivated by the availability of a complete programming environment (the SVRF scripting language), an extremely fast hierarchical database management for GDSII design layout data, and lithography simulation, OPC and ORC (Optical Rule Checking) capabilities, integrated with standard design verification functions. The Calibre environment is currently adequate for the development of a dipole software system to be used in manufacturing as part of a comprehensive dipole imaging solution.

Figure 25:
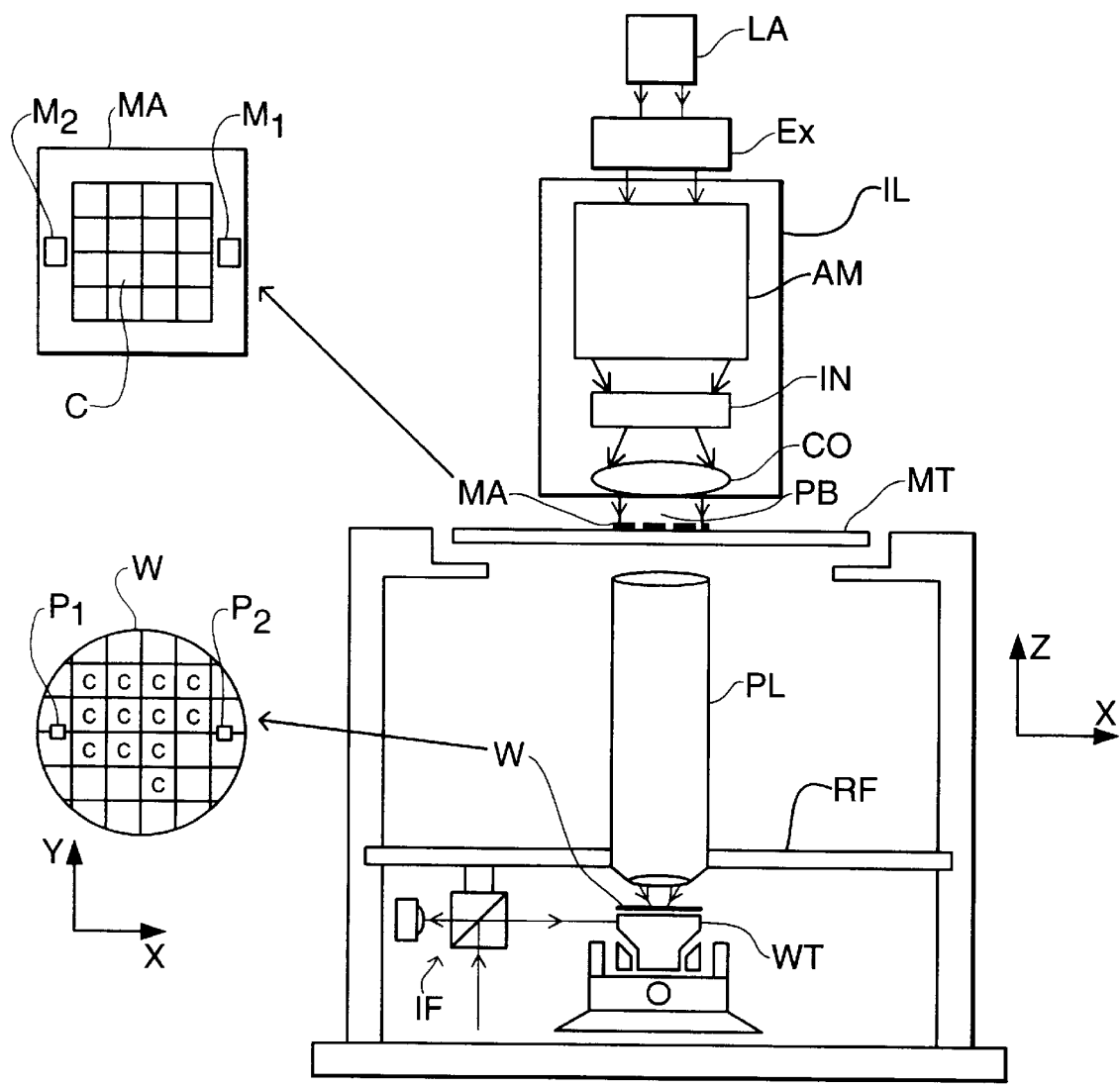
FIG. 25 schematically depicts a lithographic projection apparatus suitable for use with the masks designed with the aid of the current invention.

FIG. 25 schematically depicts a lithographic projection apparatus suitable for use with the masks designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 25 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 25. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

While specific details of various embodiments of the present invention have been presented for optimizing V-masks and H-masks for use with dipole illumination techniques, it is also clear that other variations are possible. For example, many different methods for obtaining the optimal values of the primary parameters are possible. Accordingly, it is not intended that the scope of the present invention be limited to the foregoing examples.

As described above, the method of generating complementary masks for use with dipole illumination techniques in accordance with the present invention provides significant advantages over the prior art. Most importantly, the present innovation provides a simple method of generating complementary mask layouts for use with dipole illumination techniques that automatically compensate for "intersection" areas between orthogonal features so as to allow accurate reproduction of the desired pattern on the wafer. Furthermore, the present invention provides the mask designer an additional means of effecting OPC.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating complementary masks for use in a multiple-exposure lithographic imaging process, said method comprising the steps of:

identifying horizontal critical features from a plurality of features forming a layout, identifying vertical critical features from said plurality of features, said vertical critical features extending in a direction orthogonal to said horizontal critical features, identifying interconnection areas, said interconnection areas comprising areas in which one of said horizontal critical features contacts another feature of said layout, and/or areas in which one of said vertical features contacts another feature of said layout, defining a set of primary parameters on the basis of the proximity of said plurality of features relative to one another, generating an edge modification plan for each interconnection area based on said primary parameters, generating a first shielding plan for said horizontal critical features on the basis of said primary parameters, generating a second shielding plan for said vertical critical features on the basis of said primary parameters, generating a first mask by compiling said horizontal critical features, said second shield plan for said vertical critical features and said interconnection areas containing a horizontal critical feature modified by said edge modification plan, and generating a second mask by compiling said vertical critical features, s aid first shield plan for said horizontal critical features and said interconnection areas containing a vertical critical feature modified by said edge modification plan.

2. The method of generating complementary masks for use in a multiple-exposure lithographic imaging process according to claim 1, wherein said edge modification plan comprises forming notches in said horizontal critical feature in said interconnection area so as to reduce the area of the horizontal critical feature.

3. The method of generating complementary masks for use in a multiple-exposure lithographic imaging process according to claim 1, wherein said edge modification plan comprises forming notches in said vertical critical feature in said interconnection area so as to reduce the area of the vertical critical feature.

4. The method of generating complementary masks for use in a multiple-exposure lithographic imaging process according to claim 1, wherein said edge modification plan comprises forming trenches in said horizontal critical feature in said interconnection area so as to reduce the area of the horizontal critical feature.

5. The method of generating complementary masks for use in a multiple-exposure lithographic imaging process according to claim 1, wherein said edge modification plan comprises forming trenches in said vertical critical feature in said interconnection area so as to reduce the area of the vertical critical feature.

6. The method of generating complementary masks for use in a multiple-exposure lithographic imaging process according to claim 1, wherein said primary parameters are variable within a given layout, said primary parameters changing in accordance with changes in the density of the features relative to one another within said given layout.

7. The method of generating complementary masks for use in a multiple-exposure lithographic imaging process according to claim 1, wherein a horizontal critical feature comprises a substantially rectangular portion of a polygon shaped feature having a height approximately 2 or more times greater than the critical dimension.

8. The method of generating complementary masks for use in a multiple-exposure lithographic imaging process according to claim 1, wherein a vertical critical feature comprises a substantially rectangular portion of a polygon shaped feature having a width approximately 2 or more times greater than the critical dimension.

9. The method of generating complementary masks for use in a multiple-exposure lithographic imaging process according to claim 1, wherein said multiple-exposure lithographic imaging process includes two consecutive imaging steps, each of which uses a dipole illumination configuration.

10. An apparatus for generating complementary mask patterns for use in a multiple-exposure lithographic imaging process, said apparatus comprising:

means for identifying horizontal critical features from a plurality of features forming a layout, means for identifying vertical critical features from said plurality of features, said vertical critical features extending in a direction orthogonal to said horizontal critical features, means for identifying interconnection areas, said interconnection areas comprising areas in which one of said horizontal critical features contacts another feature of said layout, and/or areas in which one of said vertical critical features contacts another feature of said layout, means for defining a set of primary parameters on the basis of the proximity of said plurality of features relative to one another, means for generating an edge modification plan for each interconnection area based on said primary parameters, means for generating a first shielding plan for said horizontal critical features on the basis of said primary parameters, means for generating a second shielding plan for said vertical critical features on the basis of said primary parameters, means for generating a first mask pattern by compiling said horizontal critical features, said second shield plan for said vertical critical features and said interconnection areas containing a horizontal critical feature modified by said edge modification plan, and means for generating a second mask pattern by compiling said vertical critical features, said first shield plan for said horizontal critical features and said interconnection areas containing a vertical critical feature modified by said edge modification plan.

11. The apparatus for generating complementary mask patterns for use in a multiple-exposure lithographic imaging process according to claim 10, wherein said edge modification plan comprises forming notches in said horizontal critical feature in said interconnection area so as to reduce the area of the horizontal critical feature.

12. The apparatus for generating complementary mask patterns for use in a multiple-exposure lithographic imaging process according to claim 10, wherein said edge modification plan comprises forming notches in said vertical critical feature in said interconnection area so as to reduce the area of the vertical critical feature.

13. The apparatus for generating complementary mask patterns for use in a multiple-exposure lithographic imaging process according to claim 10, wherein said edge modification plan comprises forming trenches in said horizontal critical feature in said interconnection area so as to reduce the area of the horizontal critical feature.

14. The apparatus for generating complementary mask patterns for use in a multiple-exposure lithographic imaging process according to claim 10, wherein said edge modification plan comprises forming trenches in said vertical critical feature in said interconnection area so as to reduce the area of the vertical critical feature.

15. The apparatus for generating complementary mask patterns for use in a multiple-exposure lithographic imaging process according to claim 10, wherein said primary parameters are variable within a given layout, said primary parameters changing in accordance with changes in the density of the features relative to one another within said given layout.

16. The apparatus for generating complementary mask patterns for use in a multiple-exposure lithographic imaging process according to claim 10, wherein a horizontal critical feature comprises a substantially rectangular portion of a polygon shaped feature having a height approximately 2 or more times greater than the critical dimension.

17. The apparatus for generating complementary mask patterns for use in a multiple-exposure lithographic imaging process according to claim 10, wherein a vertical critical feature comprises a substantially rectangular portion of a polygon shaped feature having a width approximately 2 or more times greater than the critical dimension.

18. A method of generating complementary mask patterns for use in a multiple-exposure lithographic imaging process, said method comprising the steps of:

identifying horizontal critical features and vertical critical features from a plurality of features forming a layout, said vertical critical features extending in a direction orthogonal to said horizontal critical features, identifying interconnection areas, said interconnection areas comprising areas in which one of said horizontal critical features contacts another feature of said layout, and areas in which one of said vertical critical features contacts another feature of said layout, defining a set of primary parameters on the basis of the proximity of said plurality of features relative to one another, generating an edge modification plan for each interconnection area based on said primary parameters, generating a horizontal mask pattern by compiling said horizontal critical features, a first shield plan for said vertical critical features and said interconnection areas containing a horizontal critical feature modified by said edge modification plan, said first shield plan being defined by said primary parameters, and generating a vertical mask pattern by compiling said vertical critical features, a second shield plan for said horizontal critical features and said interconnection areas containing a vertical critical feature modified by said edge modification plan, said second shield plan being defined by said primary parameters.

19. The method of generating complementary mask patterns for use in a multiple-exposure lithographic imaging process according to claim 18, wherein said multiple-exposure lithographic imaging process includes two consecutive imaging steps, each of which uses a dipole illumination configuration.

20. A device manufacturing method comprising the steps of:

(a) providing a substrate that is at least partially covered by a layer of radiation-sensitive material;

(b) providing a projection beam of radiation using a radiation system;

(c) using patterning means to endow the projection beam with a pattern in its cross-section;

(d) projecting the patterned beam of radiation onto a target portion of the layer of radiation-sensitive material, wherein steps (c) and (d) are performed a first time with a first pattern and then a second time with a second pattern, said first and second patterns being generated using a method according to claim 18.

21. An apparatus for generating complementary mask patterns for use in a multiple-exposure lithographic imaging process, said apparatus comprising:

means for identifying horizontal critical features and vertical critical features from a plurality of features forming a layout, said vertical critical features extending in a direction orthogonal to said horizontal critical features, means for identifying interconnection areas, said interconnection areas comprising areas in which one of said horizontal critical features contacts another feature of said layout, and areas in which one of said vertical critical features contacts another feature of said layout, means for defining a set of primary parameters on the basis of the proximity of said plurality of features relative to one another, means for generating an edge modification plan for each interconnection area based on said primary parameters, means for generating a horizontal mask pattern by compiling said horizontal critical features, a first shield plan for said vertical critical features and said interconnection areas containing a horizontal critical feature modified by said edge modification plan, said first shield plan being defined by said primary parameters, and means for generating a vertical mask pattern by compiling said vertical critical features, a second shield plan for said horizontal critical features and said interconnection areas containing a vertical critical feature modified by said edge modification plan, said second shield plan being defined by said primary parameters.

22. A computer program product for controlling a computer comprising a recording medium readable by the computer, means recorded on the recording medium for directing the computer to generate files corresponding to complementary masks for use in a multiple-exposure lithographic imaging process, said generation of said files comprising the steps of:

identifying horizontal critical features from a plurality of features forming a layout, identifying vertical critical features from said plurality of features, said vertical critical features extending in a direction orthogonal to said horizontal critical features, identifying interconnection areas, said interconnection areas comprising areas in which one of said horizontal critical features contacts another feature of said layout, and/or areas in which one of said vertical features contacts another feature of said layout, defining a set of primary parameters on the basis of the proximity of said plurality of features relative to one another, generating an edge modification plan for each interconnection area based on said primary parameters, generating a first shielding plan for said horizontal critical features on the basis of said primary parameters, generating a second shielding plan for said vertical critical features on the basis of said primary parameters, generating a first mask by compiling said horizontal critical features, said second shield plan for said vertical critical features and said interconnection areas containing a horizontal critical feature modified by said edge modification plan, and generating a second mask by compiling said vertical critical features, said first shield plan for said horizontal critical features and said interconnection areas containing a vertical critical feature modified by said edge modification plan.

23. The computer program product of claim 22, wherein said edge modification plan comprises forming notches in said horizontal critical feature in said interconnection area so as to reduce the area of the horizontal critical feature.

24. The computer program product of claim 22, wherein said edge modification plan comprises forming notches in said vertical critical feature in said interconnection area so as to reduce the area of the vertical critical feature.

25. The computer program product of claim 22, wherein said edge modification plan comprises forming trenches in said horizontal critical feature in said interconnection area so as to reduce the area of the horizontal critical feature.

26. The computer program product of claim 22, wherein said edge modification plan comprises forming trenches in said vertical critical feature in said interconnection area so as to reduce the area of the vertical critical feature.

27. The computer program product of claim 22, wherein said primary parameters are variable within a given layout, said primary parameters changing in accordance with changes in the density of the features relative to one another within said given layout.

28. A computer program product for controlling a computer comprising a recording medium readable by the computer, means recorded on the recording medium for directing the computer to generate files corresponding to complementary masks for use in a multiple-exposure lithographic imaging process, said generation of said files comprising the steps of:

identifying horizontal critical features and vertical critical features from a plurality of features forming a layout, said vertical critical features extending in a direction orthogonal to said horizontal critical features, identifying interconnection areas, said interconnection areas comprising areas in which one of said horizontal critical features contacts another feature of said layout, and areas in which one of said vertical critical features contacts another feature of said layout, defining a set of primary parameters on the basis of the proximity of said plurality of features relative to one another, generating an edge modification plan for each interconnection area based on said primary parameters, generating a horizontal mask pattern by compiling said horizontal critical features, a first shield plan for said vertical critical features and said interconnection areas containing a horizontal critical feature modified by said edge modification plan, said first shield plan being defined by said primary parameters, and generating a vertical mask pattern by compiling said vertical critical features, a second shield plan for said horizontal critical features and said interconnection areas containing a vertical critical feature modified by said edge modification plan, said second shield plan being defined by said primary parameters.

* * * * *